United States Patent
Kamada et al.

(10) Patent No.: US 9,496,443 B2
(45) Date of Patent: Nov. 15, 2016

(54) SOLAR CELL MODULE AND SOLAR POWER GENERATION APPARATUS

(75) Inventors: Tsuyoshi Kamada, Osaka (JP); Tsuyoshi Maeda, Osaka (JP); Hideki Uchida, Osaka (JP); Tokiyoshi Umeda, Osaka (JP); Hideomi Yui, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 16 days.

(21) Appl. No.: 14/112,723

(22) PCT Filed: Apr. 9, 2012

(86) PCT No.: PCT/JP2012/059694
§ 371 (c)(1),
(2), (4) Date: Oct. 18, 2013

(87) PCT Pub. No.: WO2012/144368
PCT Pub. Date: Oct. 26, 2012

(65) Prior Publication Data
US 2014/0026962 A1    Jan. 30, 2014

(30) Foreign Application Priority Data
Apr. 22, 2011  (JP) ................. 2011-095977

(51) Int. Cl.
*H01L 31/055* (2014.01)
*H01L 31/0232* (2014.01)
*H01L 31/054* (2014.01)

(52) U.S. Cl.
CPC ....... *H01L 31/055* (2013.01); *H01L 31/02327* (2013.01); *H01L 31/0547* (2014.12); *Y02B 10/12* (2013.01); *Y02E 10/52* (2013.01)

(58) Field of Classification Search
CPC ............. H01L 31/055; H01L 31/0547; H01L 31/0232; Y02B 10/12; Y02E 10/52
USPC ....... 62/196.2; 136/246, 248, 255, 247, 259, 136/257, 251, 256; 514/44; 126/634, 605; 307/71; 359/853; 52/173.3; 264/1.24; 345/8; 250/486.1; 348/335
See application file for complete search history.

(56) References Cited

U.S. PATENT DOCUMENTS

| 4,313,023 A * | 1/1982 | Stephens ............... H01L 31/048 136/246 |
| 7,068,898 B2 * | 6/2006 | Buretea et al. ............... 385/123 |
| 2004/0095658 A1 * | 5/2004 | Buretea ................. B82Y 20/00 359/853 |

(Continued)

FOREIGN PATENT DOCUMENTS

| JP | 61-150282 A | 7/1986 |
| JP | 61-136559 U | 8/1986 |

(Continued)

OTHER PUBLICATIONS

Official Communication issued in International Patent Application No. PCT/JP2012/059694, mailed on May 1, 2012.

*Primary Examiner* — Allison Bourke
*Assistant Examiner* — Michael Y Sun
(74) *Attorney, Agent, or Firm* — Keating & Bennett, LLP

(57) ABSTRACT

A solar cell module includes a light guide body that guides incident light to propagate therein, and a solar cell element that receives the light propagating within the light guide body, wherein the light guide body is made of a light-transmissive base material and has a curved surface in at least a part thereof.

12 Claims, 21 Drawing Sheets

(56) References Cited

U.S. PATENT DOCUMENTS

| | | | |
|---|---|---|---|
| 2006/0107993 A1* | 5/2006 | Wilhelm Krokoszinski et al. | 136/247 |
| 2008/0142076 A1* | 6/2008 | Horne | F24J 2/18 136/259 |
| 2009/0126778 A1* | 5/2009 | Brounne | H01L 31/0547 136/247 |
| 2009/0126792 A1 | 5/2009 | Gruhlke et al. | |
| 2010/0043778 A1* | 2/2010 | Penciu | 126/625 |
| 2010/0126554 A1* | 5/2010 | Morgan | H01L 31/0547 136/246 |
| 2010/0263716 A1 | 10/2010 | Kitao | |
| 2011/0011449 A1* | 1/2011 | Morgan et al. | 136/255 |
| 2011/0226307 A1* | 9/2011 | Liu | H01L 31/0547 136/246 |

FOREIGN PATENT DOCUMENTS

| | | |
|---|---|---|
| JP | 02-130430 A | 5/1990 |
| JP | 07-122771 A | 5/1995 |
| JP | 11-046008 A | 2/1999 |
| JP | 2005-217357 A | 8/2005 |
| JP | 2010-258034 A | 11/2010 |
| JP | 4599464 B1 | 12/2010 |
| JP | 2011-503902 A | 1/2011 |
| JP | 2011-77088 A | 4/2011 |

* cited by examiner

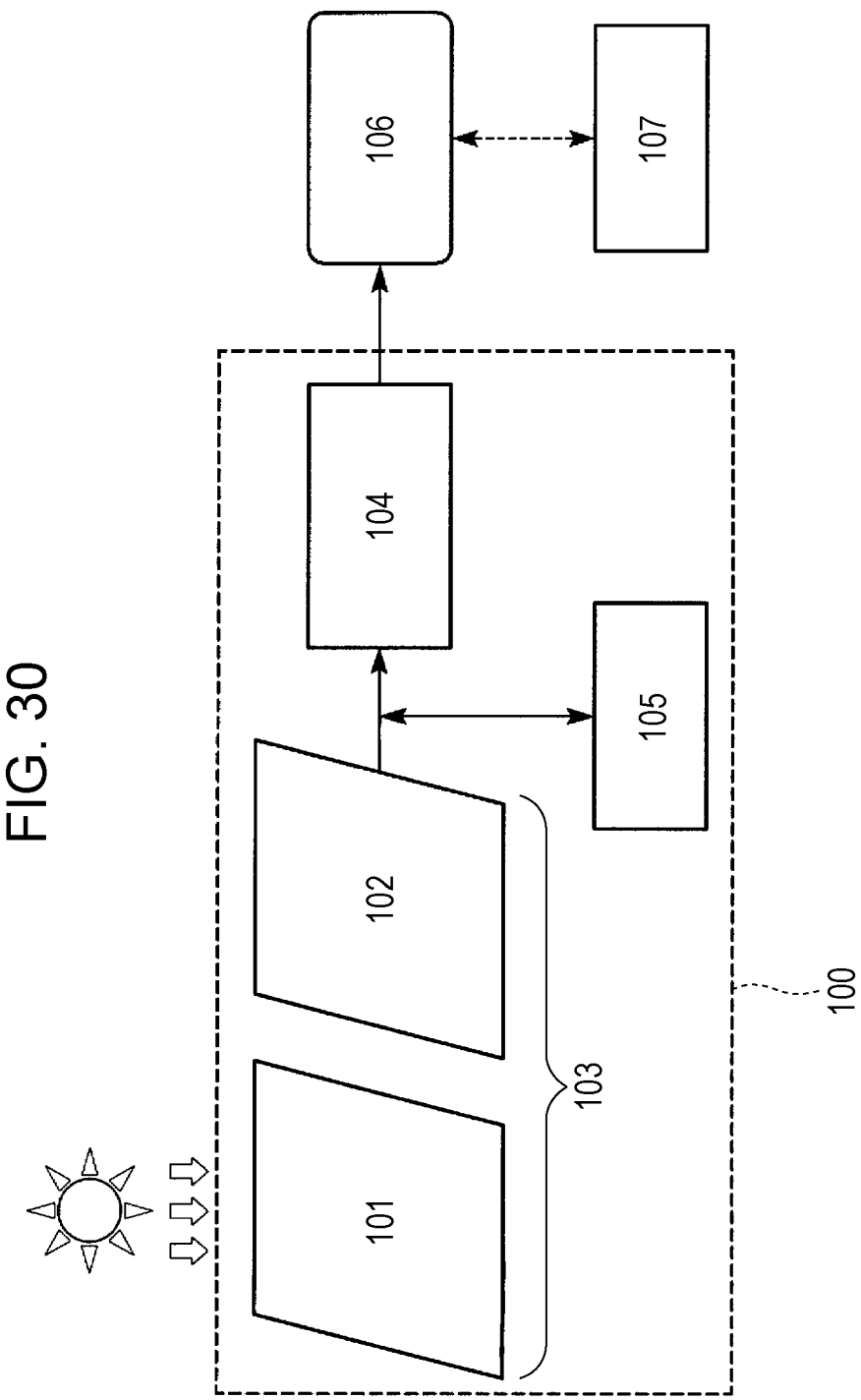

SOLAR CELL MODULE AND SOLAR POWER GENERATION APPARATUS

TECHNICAL FIELD

The present invention relates to a solar cell module and a solar power generation apparatus.

The present application claims priority to Japanese Patent Application No. 2011-095977 filed Apr. 22, 2011 in Japan, the contents of which are incorporated herein by reference in their entirety.

BACKGROUND ART

Related-art solar power generation apparatuses generally have such a form that plural solar cell panels are laid over a surface in orientation facing the sun. As one example, there is known a solar power generation apparatus of the type that plural solar cell panels are laid over the roof of a building or a house. In general, the solar cell panels are formed of opaque semiconductors, and they cannot be arranged in stacked relation. Therefore, a large-area solar cell panel is required to obtain a sufficient amount of electric power. On the other hand, there is a restriction that the apparatus has to be installed in a place, such as a roof, where an available area is limited. This has led to a limit in the amount of electric power obtained. Moreover, because the weight of the solar cell panel increases due to the associated protective glass, wired lines, and so on, the apparatus can be installed only over the roof having high strength.

In view of the situations mentioned above, the so-called "window-surface solar-cell power generation system" is proposed in which solar cells are installed in window portions that occupy a large area in a building (see Patent Literature (PTL) 1 listed below). The proposed window-surface solar-cell power generation system includes a light absorptive-emissive plate in which a phosphor is dispersed, and a solar cell, wherein a window frame is constituted by bonding the solar cell to a side surface of the window frame, the side surface being positioned perpendicular to a day-lighting surface of the light absorptive-emissive plate. In the window-surface solar-cell power generation system, the phosphor in the light absorptive-emissive plate is excited by the sunlight incident upon the light absorptive-emissive plate, and the solar cell is illuminated with radiant light from the phosphor, whereby electric power is generated.

There is also proposed a solar cell including a light collector that introduces the incident sunlight to the solar cell (see PTL 2 listed below). The light collector of the solar cell, disclosed in PTL 2, includes a light collecting member that has a flat incident surface and a scattering surface, the latter being positioned to face the incident surface with a gradually increasing distance kept from the incident surface, and to scatter light input through the incident surface. The solar cell is installed at an end surface of the light collecting member.

CITATION LIST

Patent Literature

PTL 1: Japanese Unexamined Utility Model Registration Application Publication No. 61-136559
PTL 2: Japanese Unexamined Patent Application Publication No. 7-122771

SUMMARY OF INVENTION

Technical Problem

In the case of the window-surface solar-cell power generation system disclosed in PTL 1, however, a rectangular shape, which is a general planar shape of the window, has a relatively long side relative to its area. Therefore, the light incident upon the window is reflected a larger number of times in some cases until reaching the solar cell. This causes a loss of the light due to absorption when the light is reflected. Moreover, the window is generally installed substantially vertical to the ground surface, and it is not movable in match with the azimuth of the sun. Accordingly, even when the window has a large installation area, the disclosed system cannot sufficiently utilize the installation area with respect to the sun position. In addition, the size of the disclosed system is limited by that of a building, and cannot be increased beyond the building size.

In the case of the light collector of the solar cell disclosed in PTL 2, because the light collecting member has the so-called wedge shape, the light collecting member has a considerably large thickness at the one end side thereof. As a result, the total weight of the light collector increases.

PTLs 1 and 2 exhibit a common phenomenon that because a projected area of the light collecting portion changes with motion of the sun, an amount of light received by the light collecting portion changes during a day. Correspondingly, a power generation output also varies to a large extent. Such a phenomenon can be improved by additionally providing a system that enables the light collecting portion to follow the sun. In that case, however, the entire system is complicated and expensive, and needs large-scale maintenance.

Embodiments of the present invention are accomplished to solve the above-mentioned problems, and an object of the embodiments is to provide a solar cell module that has relatively high power generation efficiency with respect to an installation area. Another object is to provide a solar cell module in which variations of a power generation output attributable to motion of the sun are relatively small. Still another object is to provide a solar cell module which is light-weight and is easy to install. Still another object is to provide a solar cell module of which cost is relatively low. Still another object is to provide a solar power generation apparatus that includes the solar cell module having the above-mentioned advantages.

Solution to Problem

To achieve the above object, according to one aspect of the present invention, there is provided a solar cell module comprising a light guide body that guides incident light to propagate therein, and a solar cell element that receives the light propagating within the light guide body, wherein the light guide body is made of a light-transmissive base material and has a curved surface in at least a part thereof.

In the solar cell module according to one aspect of the present invention, the light guide body may be constituted as a hollow shell-shaped structural body made of the light-transmissive base material.

In the solar cell module according to one aspect of the present invention, the structural body may be a hollow spherical body.

In the solar cell module according to one aspect of the present invention, the solar cell element may be arranged in a portion corresponding to ½ of a circumference of a circle that is formed by intersection of a plane, which passes a center of the spherical body, and a surface of the spherical body.

In the solar cell module according to one aspect of the present invention, the structural body may be a hollow elliptical body.

In the solar cell module according to one aspect of the present invention, the light guide body may be rotatable about an axis passing a center of the elliptical body except for an axis of rotational symmetry of the elliptical body.

In the solar cell module according to one aspect of the present invention, the inside of the light guide body may be an enclosed space, and the light guide body may have a gas inlet/outlet through which gas is filled into and discharged from the enclosed space.

In the solar cell module according to one aspect of the present invention, gas having lower specific gravity than air outside the light guide body may be filled and confined in the enclosed space.

In the solar cell module according to one aspect of the present invention, the light guide body may be constituted as a structural body made of the light-transmissive base material, the structural body having an opening and an open inner space.

In the solar cell module according to one aspect of the present invention, the structural body may be a hemispherical body.

In the solar cell module according to one aspect of the present invention, the solar cell element may be arranged at an end surface of the structural body, the end surface corresponding to an edge of the opening.

In the solar cell module according to one aspect of the present invention, the light-transmissive base material constituting the light guide body may have flexibility.

In the solar cell module according to one aspect of the present invention, the light guide body may contain a phosphor generating fluorescent light upon being excited by the incident light, and the solar cell element may receive the fluorescent light generated inside the light guide body with the incident light and propagating within the light guide body.

In the solar cell module according to one aspect of the present invention, density of the phosphor contained in the light guide body may be not uniform.

In the solar cell module according to one aspect of the present invention, the density of the phosphor contained in a first portion of the light guide body may be relatively large, and the density of the phosphor contained in a second portion of the light guide body may be relatively small, the second portion being positioned on opposite side to the first portion.

In the solar cell module according to one aspect of the present invention, the light guide body may include an uneven portion having a reflecting surface to reflect light entering through one surface of the light guide body and to change a propagating direction of the light, and the solar cell element may receive the outside light that is reflected by the reflecting surface after having entered the light guide body, and that propagates within the light guide body.

In the solar cell module according to one aspect of the present invention, the light guide body may include a reflecting portion that reflects, toward the solar cell element, the light propagating within the light guide body.

In the solar cell module according to one aspect of the present invention, the solar cell element may be embedded in the light guide body.

In the solar cell module according to one aspect of the present invention, the solar cell element may be arranged on a surface of the light guide body.

In the solar cell module according to one aspect of the present invention, a protective member may be disposed outside the light guide body to cover the light guide body with a spacing kept relative to the light guide body.

According to another aspect of the present invention, there is provided a solar power generation apparatus including the solar cell module mentioned above.

In the solar power generation apparatus according to another aspect of the present invention, the solar power generation apparatus may include the solar cell module in plural number, the plural solar cell modules being arranged in a planar array.

According to still another aspect of the present invention, there is provided a method of installing a solar cell module comprising a light guide body that guides incident light to propagate therein, and a solar cell element that receives the light propagating within the light guide body, the light guide body being made of a light-transmissive base material and having a curved surface in at least a part thereof, the light guide body containing a phosphor that generates fluorescent light upon being excited by the incident light, the solar cell element receiving the fluorescent light generated inside the light guide body with the incident light and propagating within the light guide body, the method including a step of installing the solar cell module such that a first portion of the light guide body in which density of the phosphor is relatively large in a portion closer to the sun is positioned closer to the sun, and a second portion of the light guide body in which density of the phosphor is relatively small is positioned farther away from the sun, the second portion being positioned on opposite side to the first portion.

Advantageous Effects of Invention

According to the embodiments of the present invention, the solar cell module having relatively high power generation efficiency with respect to an installation area can be provided. The solar cell module can be provided in which variations of a power generation output attributable to motion of the sun are relatively small. The solar cell module being light-weight and being easy to install can be provided. The solar cell module with a relatively low cost can be provided. The solar power generation apparatus can be provided which includes the solar cell module having the above-mentioned various advantages.

BRIEF DESCRIPTION OF DRAWINGS

FIG. 30 is a block diagram of a solar power generation apparatus according to the present invention.

DESCRIPTION OF EMBODIMENTS

First Embodiment

Figure 2:
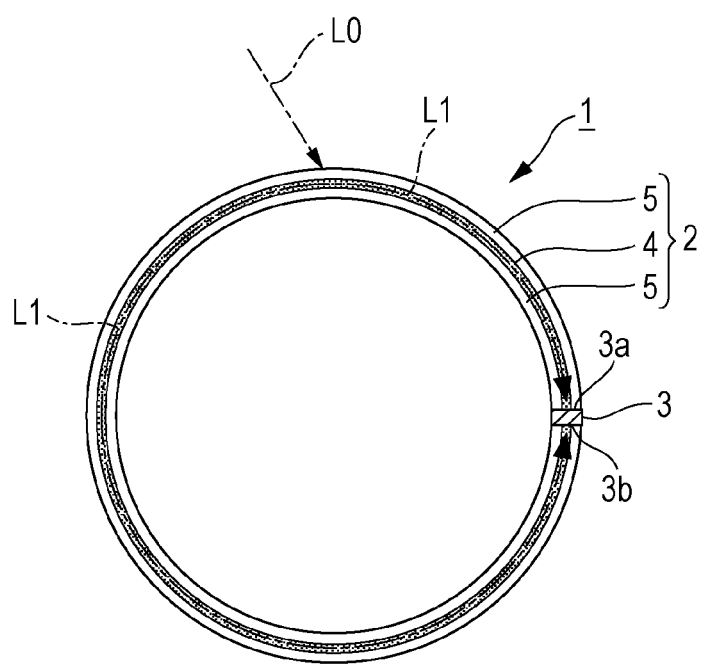
FIG. 2 is a sectional view of the solar cell module according to the first embodiment of the present invention.
Figure 3:
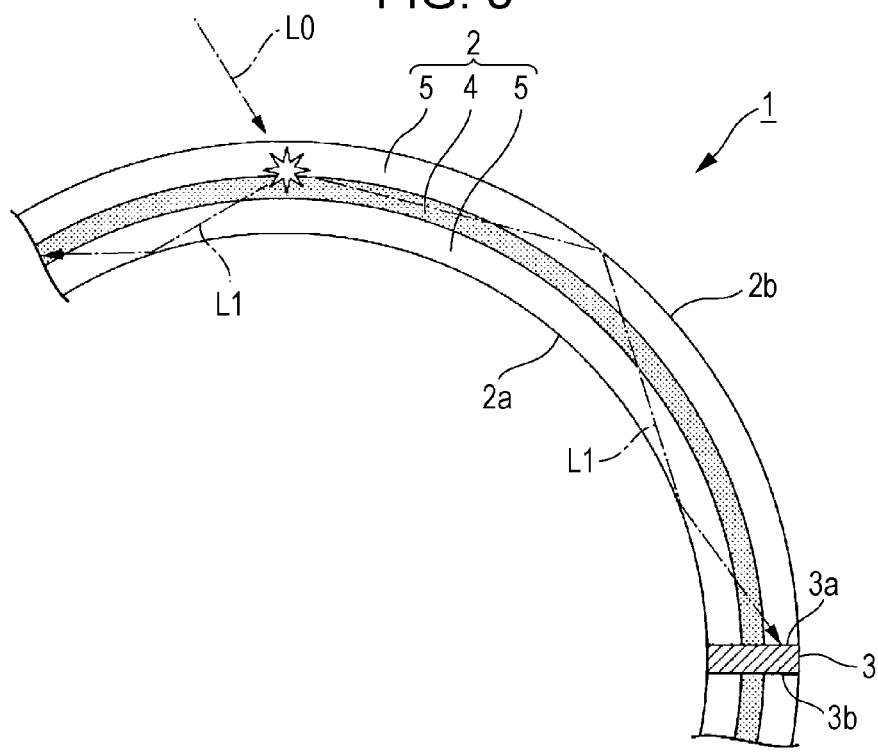
FIG. 3 is an enlarged view of a part of FIG. 2.

A first embodiment of the present invention will be described below with reference to FIGS. 1 to 3.

The first embodiment represents an example of a solar cell module including a light guide body having a hollow spherical shape.

Figure 1:
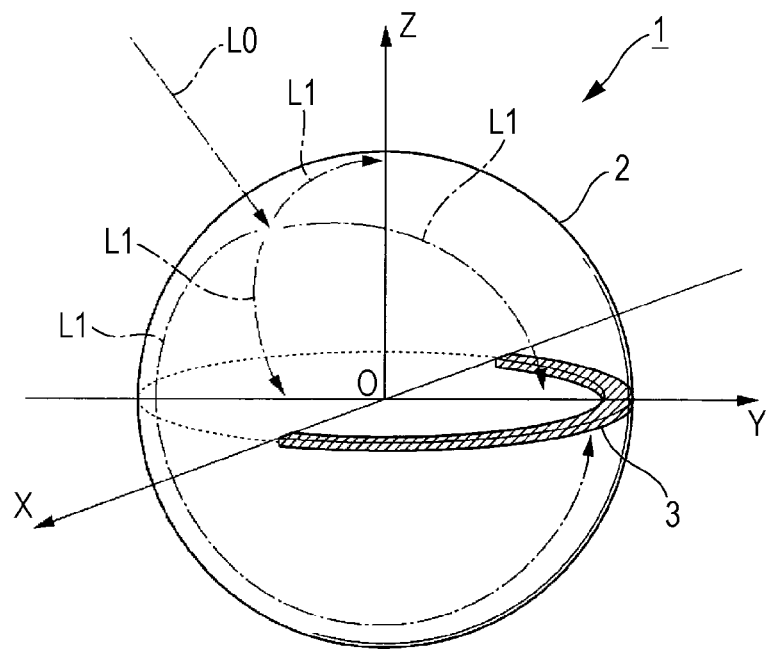
FIG. 1 is a perspective view of a solar cell module according to a first embodiment of the present invention.

FIG. 1 is a perspective view of a solar cell module according to the first embodiment. FIG. 2 is a sectional view of the solar cell module. FIG. 3 is an enlarged view of a part of FIG. 2.

It is to be noted that, in all the drawings referred to below, dimensions of some constituent elements are illustrated in different scales for the sake of clearer understanding of the constituent elements in appearance.

A solar cell module 1 according to the first embodiment includes, as illustrated in FIG. 1, a light guide body 2 and a solar cell element 3. The light guide body 2 is made of a light-transmissive base material and is constituted as a shell-like spherical body (structural body) of which inner side is an enclosed space. While in the first embodiment the inside of the spherical body is the enclosed space, the inside is not always required to be the enclosed space. For example, the spherical body may be partly opened such that the inside of the spherical body forms an opened space. The light-transmissive base material may be, for example, organic materials having high transparency, such as an acrylic resin, a polycarbonate resin, a polystyrene resin, and a cycloolefin polymer resin. As another example, an inorganic material having high transparency, such as glass, can also be used. However, the light-transmissive base material is not limited to the above-mentioned materials. Dimensions of the light guide body 2 are set, for example, such that a radius of the spherical body is about 250 mm and a thickness of the light guide body 2 is about 1 mm. In the following description, as illustrated in FIG. 1, three axes passing a center of the spherical body and being orthogonal to one another are defined as x-, y- and z-axes.

The light guide body 2 contains therein a phosphor that is excited by outside light L0 (sunlight), and that emits fluorescent light L1. The light guide body 2 has the function of guiding, to the solar cell element 3, the fluorescent light L1 emitted from the phosphor upon receiving the outside light L0 input as excitation light. The solar cell element 3 has the function of generating electric power by receiving the fluorescent light L1, which is emitted from the phosphor with the input of the outside light L0 and which is guided to propagate within the light guide body 2. In the first embodiment, as illustrated in FIG. 2, the light guide body 2 is constituted by sandwiching a phosphor layer 4, containing the phosphor, between light-transmissive base materials 5 made of an acrylic resin, for example, from both sides. In other words, the light guide body 2 has a three-layer structure of the light-transmissive base material 5/the phosphor layer 4/the light-transmissive base material 5.

The light guide body 2 having the above-described structure can be fabricated, for example, by forming an inner spherical body made of an acrylic resin, and then successively coating a phosphor material and an acrylic resin over the outer side of the inner spherical body in a state of the solar cell element 3 being fixedly held on the inner spherical body, thereby forming the phosphor layer 4 and an outer spherical body in the mentioned order. In the following description, a surface of the light guide body 2 facing an inner space thereof is called an "inner surface", and a surface of the light guide body 2 facing a space outside the light guide body 2 is called an "outer surface".

The phosphor layer 4 contains, e.g., a phosphor absorbing visible light and infrared light and emitting visible light and infrared light, or a phosphor absorbing ultraviolet light and emitting visible light. As one example, the phosphor layer 4 may contain plural types of phosphors, e.g., 0.02% of Lumogen F Violet 570 (trade name) made by BASF Co., 0.02% of Lumogen F Yellow 083 (trade name) made by BASF Co., 0.02% of Lumogen F Orange 240 (trade name) made by BASF Co., 0.02% of Lumogen F Red 305 (trade name) made by BASF Co., 0.5% of NILE BLUE A (CAS Registration No. 3625-57-8), 0.5% of Ir-140 (CAS Registration No. 53655-17-7), 0.5% of Ir-144 (CAS Registration No. 54849-69-3), and 3% of quantum dot PbS (lead sulfide). Fluorescent light having a wide wavelength region of about 400 nm to 1500 nm is emitted from the phosphor layer 4 containing the above-mentioned plural types of phosphors.

As illustrated in FIG. 1, the solar cell element 3 is arranged in a portion corresponding to ½ of the circumference of a circle that is formed by intersection of a plane (xy-plane), which passes a center O of the spherical body constituting the light guide body 2, and the surface of the spherical body. In other words, the solar cell element 3 has a shape of one of halves obtained by dividing a circular ring. As illustrated in FIG. 2, the solar cell element 3 is embedded in the light guide body 2 in the plane (xy-plane) passing the center of the spherical body. Two surfaces $3a$ and $3b$ (i.e., an upper surface $3a$ and a lower surface $3b$ in FIG. 2) of the solar cell element 3, both contacting with the light guide body 2, serve as light receiving surfaces. In practice, therefore, the solar cell element 3 is preferably constituted by bonding two solar cell elements in back-to-back relation such that respective surfaces of both the elements opposite to their light receiving surfaces face each other. In the following description of the first embodiment, however, those two solar cell elements are regarded as one solar cell element. Known solar cells, e.g., a silicon solar cell, a compound solar cell, and an organic solar cell, can be optionally used as the solar cell element 3.

Among the above-mentioned solar cells, the compound solar cell using a compound semiconductor is suitably used in the first embodiment because of having high power generation efficiency. One example of the compound solar cell is in form stacking an InGaAs layer, a GaAs layer, and an InGaP layer on a semiconductor substrate. That type of compound solar cell has high power generation efficiency of 80% or more in the wavelength region of 400 nm to 1200 nm and 95% or more in the wavelength region of 500 nm to 950 nm.

Accordingly, highly-efficient power generation can be realized in a wide wavelength region by combining the above-mentioned phosphor and the above-mentioned compound solar cells.

In the solar cell module 1 constructed as described above, when the light guide body 2 is illuminated with the outside light L0 (sunlight), the outside light L0 serves as excitation light, and the phosphor in the phosphor layer 4 emits light. As illustrated in FIG. 3, a large part of the emitted fluorescent light L1 is guided to propagate in a state confined within the light guide body 2 while repeating total reflection between an inner surface $2a$ and an outer surface $2b$ of the light guide body 2. When the spherical body of the light guide body 2 has a certain curvature radius or more, the emitted fluorescent light L1 can continuously propagate within the light guide body 2 if there is no absorption loss. Although the emitted fluorescent light L1 propagates in all directions, the propagating light is always guided along the circumference of a circle that is formed by intersection of an arbitrary plane, which passes an incident point of the outside light L0 and the center of the spherical body, and the surface of the spherical body. Accordingly, when the solar cell element 3 is arranged in the portion corresponding to ½ of the circumference of the circle that is formed by the intersection of the plane passing the center of the spherical body and the surface of the spherical body, almost all of the fluorescent light L1 emitted from the phosphor layer 4 positively reaches the solar cell element 3 through a round or shorter path, as illustrated in FIG. 1.

Because the light guide body 2 in the first embodiment is the spherical body, the area of a circle, which is a figure resulting from projecting the spherical body from an arbitrary direction toward a plane perpendicular to the arbitrary direction, corresponds to a light receiving area of the light guide body 2. The light incident upon the light receiving area (i.e., the area of the above-mentioned circle) can be collected to the solar cell element 3 having an area corresponding to the product of the circumference×½×the thickness of the light guide body 2. Since a figure having the shortest circumferential length with respect to a certain area is a circle, the solar cell module 1 having maximum light collection efficiency in principle can be realized. Taking the above-described dimensions as an example, since the light receiving area of the light guide body 2 is 250×250×π (mm$^2$) and the area of the solar cell element 3 is 250×2×π×½×1 (mm$^2$), a ratio of the light receiving area of the light guide body 2 to the area of the solar cell element 3 is 250. Such a value cannot be obtained with a light guide body having a rectangular shape, for example.

Furthermore, a figure resulting from projecting a sphere toward a plane is always a circle in any direction, and an area of the projected circle does not change. In the case of the solar cell module 1 including the spherical light guide body 2 according to the first embodiment, therefore, even when the position of the sun changes with temporal variations and seasonal variations, the power generation output does not vary to a large extent unless the intensity of the sunlight changes greatly. In addition, the spherical light guide body 2 can receive not only light directly arriving from the sun, but also lights arriving from all directions after being reflected and scattered by clouds, grounds, buildings, etc. Such an advantageous point also contributes to giving the solar cell module 1 of the first embodiment with higher power generation efficiency.

In the case using the phosphor layer 4, if the phosphor layer 4 is exposed to the outer surface of the light guide body 2, a part of the fluorescent light L1 emitted from the phosphor layer 4 is released to the outside space, and a light component guided to propagate within the light guide body 2 is reduced. In contrast, in the light guide body 2 according to the first embodiment, since the phosphor layer 4 is sandwiched between the light-transmissive base materials 5 from both sides, almost all of the fluorescent light L1 emitted from the phosphor layer 4 is guided to propagate within the light guide body 2. As a result, the solar cell module 1 having higher light collection efficiency can be realized.

Although the light guide body 2 has a certain volume, the weight of the solar cell module 1 can be reduced because the inside of the light guide body 2 is hollow. Moreover, an installation area of the solar cell module 1 can be reduced in terms of proportion relative to the volume of the light guide body 2. With those advantageous effects, the solar cell module 1 according to the first embodiment can be installed even in a place where the foundation is not so strong, or even in a place where an available area is limited. Thus, the degree of freedom in selecting the installation place is improved. In addition, the cost of the solar cell module 1 can be reduced.

First Modification of First Embodiment

Figure 4:
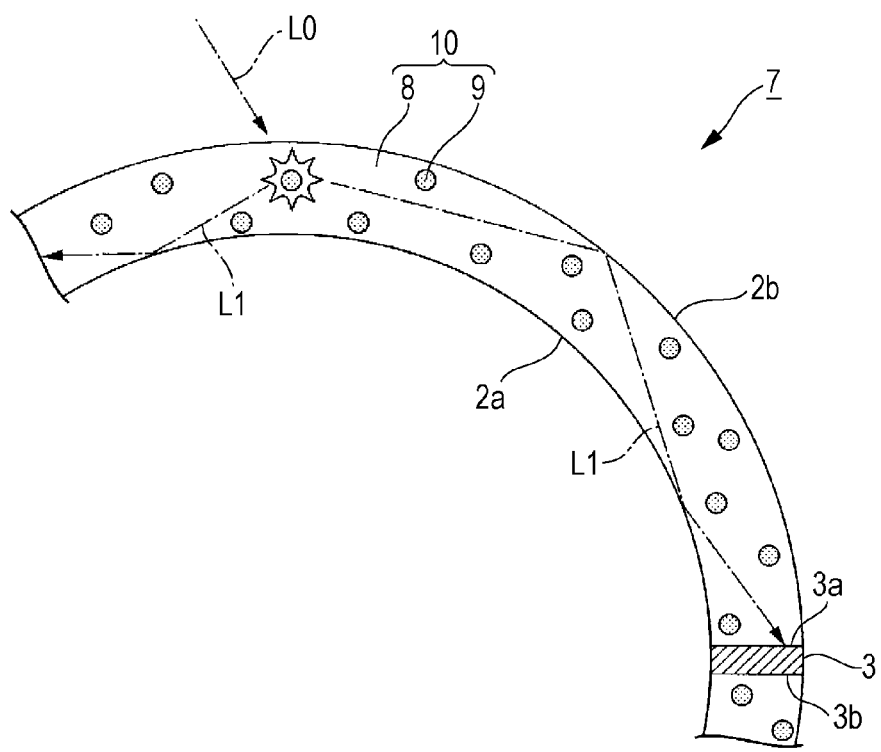
FIG. 4 is a sectional view illustrating a first modification of the solar cell module according to the first embodiment of the present invention.

In the first embodiment, the light guide body 2 is employed which has the structure sandwiching the phosphor layer 4 between the light-transmissive base materials 5 from both sides. A solar cell module 7 of a first modification employs, instead of the light guide body 2, a light guide body 10 in which particulate phosphors 9 are dispersed within a light-transmissive base material 8, as illustrated in FIG. 4. The light guide body 10 may be fabricated, for example, by previously preparing an acrylic resin in which the phosphors 9 are dispersed, and by injection-molding the acrylic resin to form a spherical body, which becomes the light guide body 10.

Second Modification of First Embodiment

Figure 5:
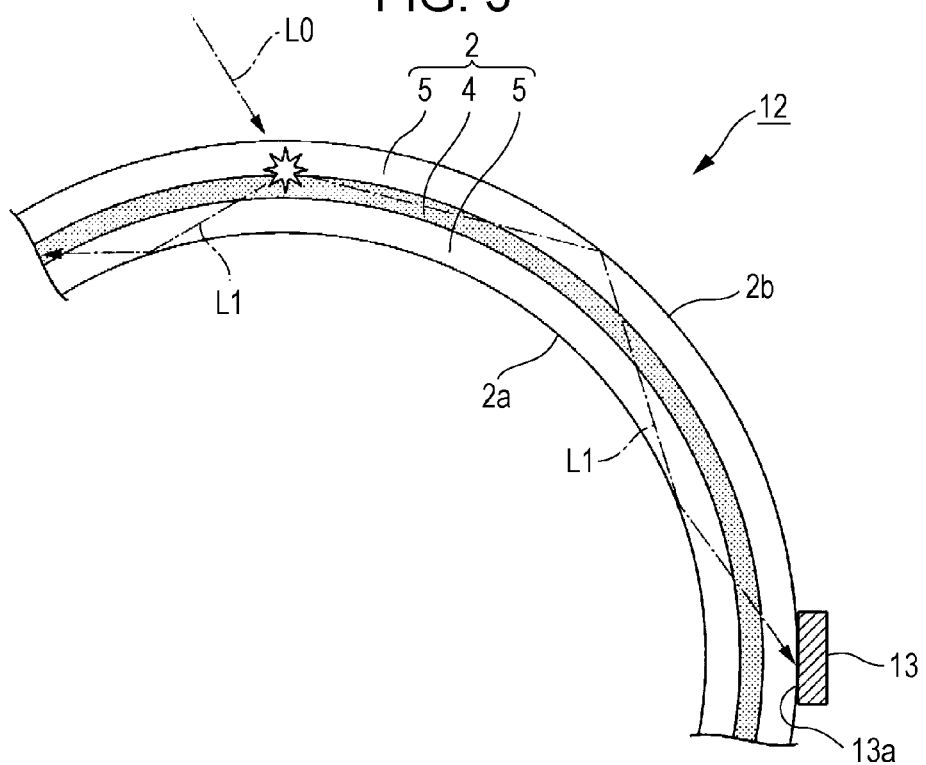
FIG. 5 is a sectional view illustrating a second modification of the solar cell module according to the first embodiment of the present invention.

In the first embodiment, the solar cell element 3 is embedded in the light guide body 2. In a solar cell module 12 of a second modification, instead of the embedded structure, a solar cell element 13 is bonded to the outer surface 2b of the light guide body 2, as illustrated in FIG. 5. In this structure, a light receiving surface 13a of the solar cell element 13 is arranged to face the light guide body 2. As described above, the fluorescent light L1 emitted from the phosphor layer 4 is guided to propagate within the light guide body 2 while repeating total reflection. Accordingly, unless the light guide body 2 is too thick, the solar cell element 13 can sufficiently receive the fluorescent light L1 even with the solar cell element 13 arranged on the outer surface 2b of the light guide body 2. The solar cell module 12 has a simpler structure than the case of embedding the solar cell element 13 in the light guide body 2, and it can be manufactured more easily. While FIG. 5 illustrates an example in which the solar cell element 13 is bonded to the outer surface 2b of the light guide body 2, the solar cell element 13 may be bonded, as another example, to the inner surface 2a of the light guide body 2 or to both the outer surface 2b and the inner surface 2a of the light guide body 2.

Third Modification of First Embodiment

Figure 6:
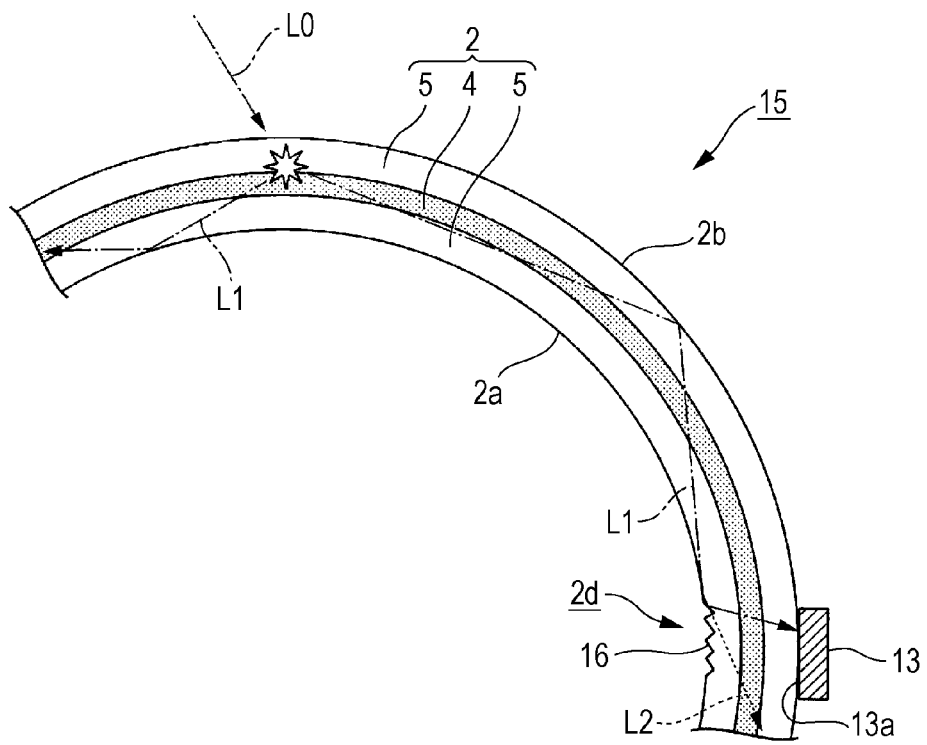
FIG. 6 is a sectional view illustrating a third modification of the solar cell module according to the first embodiment of the present invention.

Although the solar cell element 13 can also sufficiently receive the fluorescent light L1 in the second modification, there is a possibility that if the fluorescent light L1 passes by the installed position of the solar cell element 13 and propagates round again within the light guide body 2, a light loss may occur and the fluorescent light L1 may be wasted. To cope with such a possibility, as illustrated in FIG. 6, a solar cell element 15 of a third modification includes an uneven portion 2d, which is provided in the inner surface 2a of the light guide body 2 at a position substantially opposing to the installed position of the solar cell element 13, and a reflecting layer 16 is provided on a surface of the uneven portion 2d. The uneven portion 2d is formed by processing the inner surface of the light guide body 2 to have irregularities. The reflecting layer 16 is provided by forming a metal layer or a dielectric multilayer film on the surface of the uneven portion 2d. While the uneven portion 2d is illustrated in FIG. 6 as having individual irregularities in triangular sectional shape, the uneven portion 2d is not always required to have the triangular sectional shape insofar as the action of scattering the incident light is obtained.

If the uneven portion 2d is not provided in the inner surface 2a of the light guide body 2, the fluorescent light L1 reflected by the inner surface 2a of the light guide body 2 comparatively near the installed position of the solar cell element 13 may pass by the position of the solar cell element 13 as denoted by an dotted-line arrow L2 in FIG. 6. In contrast, when the uneven portion 2d and the reflecting layer 16 are provided in the inner surface 2a of the light guide body 2, the fluorescent light L1 incident on the uneven portion 2d and the reflecting layer 16 are reflected and scattered such that part of the fluorescent light L1 enters the solar cell element 13. Stated in another way, part of the fluorescent light L1, the part passing by the position of the solar cell element 13, can be guided to the solar cell element 13 by the uneven portion 2d and the reflecting layer 16. As a result, the power generation efficiency can be increased in the structure that the solar cell element 13 is bonded to the outer surface 2b of the light guide body 2.

When the solar cell element 13 is installed on the inner surface of the light guide body 2, the uneven portion 2d may be provided in the outer surface 2b of the light guide body 2. Instead of providing the uneven portion 2d and the reflecting layer 16, the thickness of the light guide body 2 may be partly reduced in a region where the solar cell element 13 is installed, or thereabout. In such a case, the number of total reflections of the light increases in the region where the thickness of the light guide body 2 is reduced than in the other region. As a result, a proportion of the light incident on the solar cell element 13 increases, whereby the power generation efficiency can be increased.

Second Embodiment

A second embodiment of the present invention will be described below with reference to FIG. 7.

A solar cell module according to the second embodiment is similar in basic structure to that in the first embodiment, and is different from the first embodiment in structure of the light guide body.

Figure 7:
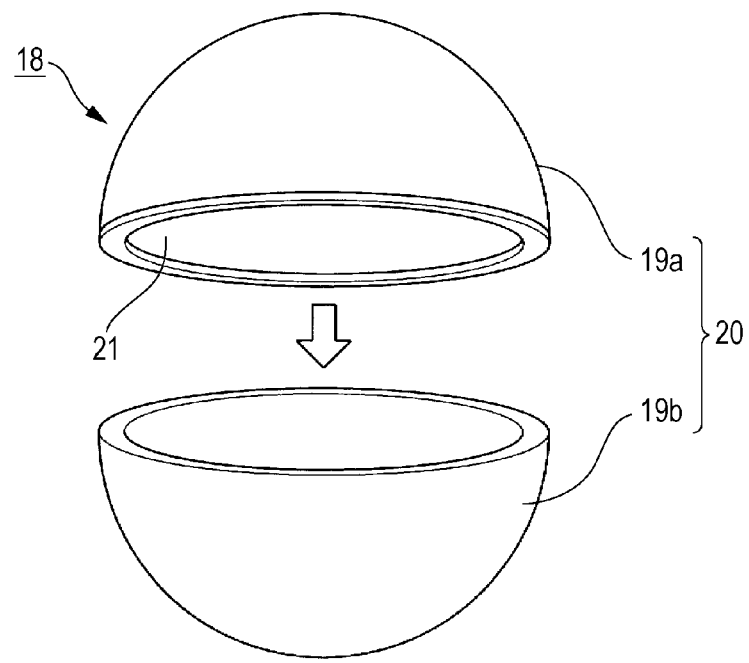
FIG. 7 is a perspective view of a solar cell module according to a second embodiment of the present invention.

FIG. 7 is a perspective view of the solar cell module according to the second embodiment.

In the first embodiment, the light guide body 2 has an entirely integral structure with no seams. It is however difficult to mold the light guide body 2 such that an entire surface of the light guide body 2 has a smooth spherical surface. If the spherical surface of the light guide body 2 is not smooth, the total reflection of the light would be impeded, and a light loss would be caused, thus reducing the efficiency in light collection to the solar cell element 3.

In view of the above-mentioned point, as illustrated in FIG. 7, a solar cell module 18 according to the second embodiment includes a light guide body 20 having a structure that two hollow hemispherical bodies 19a and 19b are bonded to each other. Comparing with the case of molding a spherical body, it is easier to smoothly form the body surface in the case of molding a hemispherical body. However, a light loss is more apt to occur at a joined interface between the two hemispherical bodies 19a and 19b during the propagation of the light. From that point of view, it is desired that a path of the light propagating from the emission point to the solar cell element does not pass the joined interface between the two hemispherical bodies 19a and 19b. Such a condition can be satisfied by arranging a solar cell element 21 at an end surface of one hemispherical body 19a over an entire circumference of the edge thereof, and by bonding the other hemispherical body 19b to the one 19a with the solar cell element 21 held between both the hemispherical bodies 19a and 19b.

Thus, in the second embodiment, the solar cell element 21 is arranged over the entire circumference of the circle that is formed by intersection of a plane passing a center of the light guide body 20 and the surface of the light guide body 20. Accordingly, fluorescent light emitted from a phosphor layer (not illustrated) and guided to propagate in any direction reaches the solar cell element 21 through a ½ round or shorter path. In the second embodiment, since the joined interface between the hemispherical bodies 19a and 19b is not present midway the path through which the light reaches the solar cell element 21, a light loss is less likely to occur at the joined surface, and the sufficient efficiency in light collection to the solar cell element 21 can be ensured.

The second embodiment can also provide similar advantageous effects to those in the first embodiment, i.e., such capabilities as realizing the solar cell module with high light collection efficiency, suppressing the variations in power generation output, reducing the weight and the cost of the solar cell module, and improving the degree of freedom in selecting the installed position of the solar cell module.

First Modification of Second Embodiment

Figure 8:
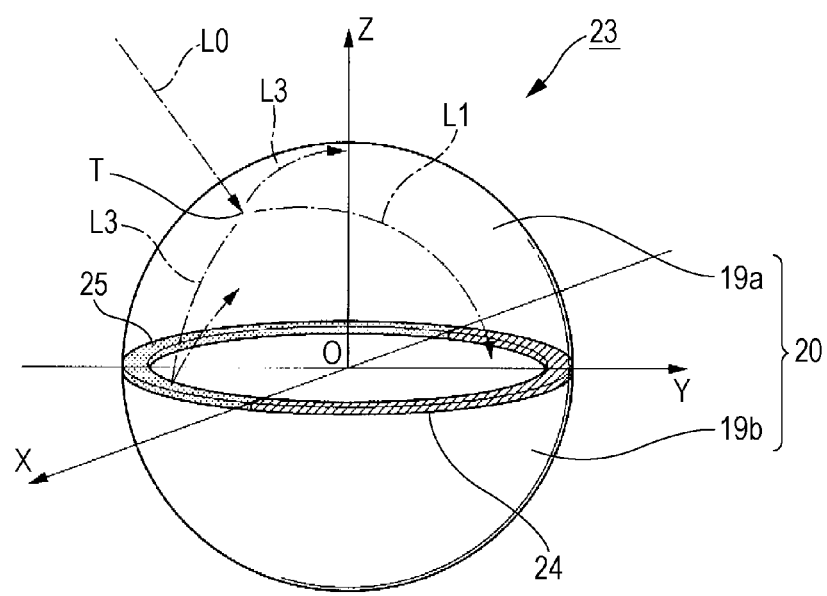
FIG. 8 is a sectional view illustrating a first modification of the solar cell module according to the second embodiment of the present invention.

In the second embodiment, the solar cell element is arranged at the end surface of the hemispherical light guide body over an entire circumference. Instead of such a structure, the solar cell element may be arranged in a part of the end surface of the hemispherical light guide body. In a solar cell module 23 illustrated in FIG. 8, for example, a solar cell element 24 is arranged in a portion corresponding to ½ of the end surface of each of the hemispherical bodies 19a and 19b constituting the light guide body 20, and a reflecting portion 25 is formed in a portion corresponding to the remaining ½ of the end surface. The reflecting portion 25 is provided by forming, e.g., a metal film having a high optical reflectance on one of the end surfaces of the hemispherical bodies 19a and 19b. More specifically, the reflecting portion 25 may be provided by forming a metal film made of aluminum or silver, for example, on one of the end surfaces of the hemispherical bodies 19a and 19b with, e.g., vapor deposition, or by forming a dielectric multilayer film made of silicon oxide/titanium oxide, for example, on the same. In addition, the reflecting portion 25 may have a smooth surface or an uneven surface. However, when the reflecting portion 25 has an uneven surface, it is desired, from the viewpoint of avoiding leakage of the light from the light guide body 20, that there are no irregularities extending in directions parallel to the inner and outer surfaces of the light guide body 20.

In the solar cell module 23 of this modification, part of the fluorescent light L1 emitted from the phosphor layer (not illustrated), the part propagating in directions toward the solar cell element 24 from a light emission point T, is directly received by the solar cell element 24. On the other hand, fluorescent light L3 propagating in directions toward the reflecting portion 25 from the light emission point T is reflected by the reflecting portion 25, then travels in directions toward the solar cell element 24, and is received by the solar cell element 24. Thus, almost all of the fluorescent lights L1 and L3 propagating in any directions from the light emission point T are finally received by the solar cell element 24. With the solar cell module 23 of this modification, an amount of the solar cell element 24 to be used can be reduced, and cost reduction can be realized.

Third Embodiment

A third embodiment of the present invention will be described below with reference to FIG. 9.

A solar cell module according to the third embodiment is similar in basic structure to that in the first embodiment, and is different from the first embodiment just in shape of the light guide body.

Figure 9:
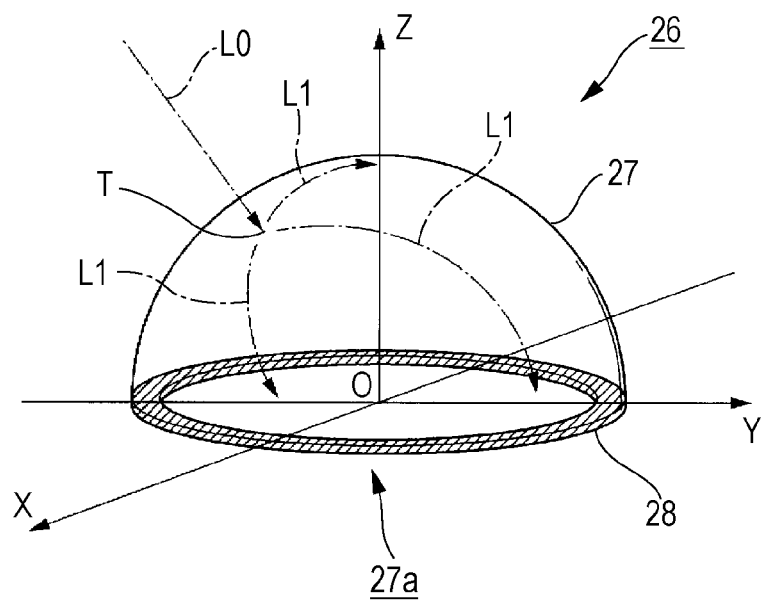
FIG. 9 is a perspective view of a solar cell module according to a third embodiment of the present invention.

FIG. 9 is a perspective view of the solar cell module according to the third embodiment.

A solar cell module 26 according to the third embodiment includes, as illustrated in FIG. 9, a hollow hemispherical light guide body 27 and a solar cell element 28. The light guide body 27 has an opening 27a on the side facing an xy-plane, and it is constituted by a hemispherical light-transmissive base material having an inner open space. The solar cell element 28 is arranged at an end surface of the hemispherical light guide body 27 over an entire circumference. It can also be said that the solar cell module 26 according to the third embodiment is constituted by the upper half 19a of the two light guide bodies 19a and 19b, both constituting the solar cell module 18 of the second embodiment illustrated in FIG. 7, and the solar cell element 21.

The solar cell module 26 according to the third embodiment is installed on a horizontal surface on the rooftop of a building or the ground, for example, in such a posture that the end surface side of the light guide body 27 where the solar cell element 28 is arranged (i.e., the side including the opening 27a) is directed downward. In the case of installing the light guide body 26 on the horizontal surface, because the light guide body 27 has the hemispherical shape, a figure resulting from projecting the light guide body 27 toward the horizontal surface from above in the vertical direction is a circle. However, a figure resulting from projecting the light guide body 27 toward a plane from any direction is not always a circle. For example, a figure resulting from projecting the light guide body 27 from an oblique upper point has a shape of a collapsed circle. Accordingly, in the light guide body 27 in the third embodiment, the shape of the projected figure changes depending on the viewing direction, and an area of the figure also changes correspondingly. Thus, a light receiving area of the light guide body 27 in the third embodiment changes depending on the position of the sun.

In the solar cell module 26 according to the third embodiment, therefore, variations in power generation output depending on the position of the sun are larger than the solar cell modules according to the first and second embodiments in each of which the light guide body is spherical.

In the morning and the evening, for example, where the sun is in a fairly low position, the power generation output tends to reduce with a decrease in the light receiving area of the light guide body 27. However, the variations in power generation output can be suppressed in comparison with those in the related-art solar cell module including the flat light guide body. Furthermore, the solar cell module 26 according to the third embodiment can be more easily manufactured because of not needing the step of joining the two light guide bodies to each other unlike the solar cell module 18 according to the second embodiment. In addition, the solar cell module 26 according to the third embodiment has good stability after installation because it is installed in the posture that the end surface side of the light guide body 27 (i.e., the side including the opening 27a) is directed downward.

The third embodiment can also provide similar advantageous effects to those in the first embodiment, i.e., such capabilities as realizing the solar cell module with high light collection efficiency, suppressing the variations in power generation output, reducing the weight and the cost of the solar cell module, and improving the degree of freedom in selecting the installed position of the solar cell module. It is to be noted that the light guide body 27 is not always required to have a complete hemispherical shape, and it may have a shape resulting from dividing a sphere at an arbitrary plane.

First Modification of Third Embodiment

In the third embodiment, the solar cell element 28 is arranged at the end surface of the hemispherical light guide body 27 over an entire circumference.

Figure 10:
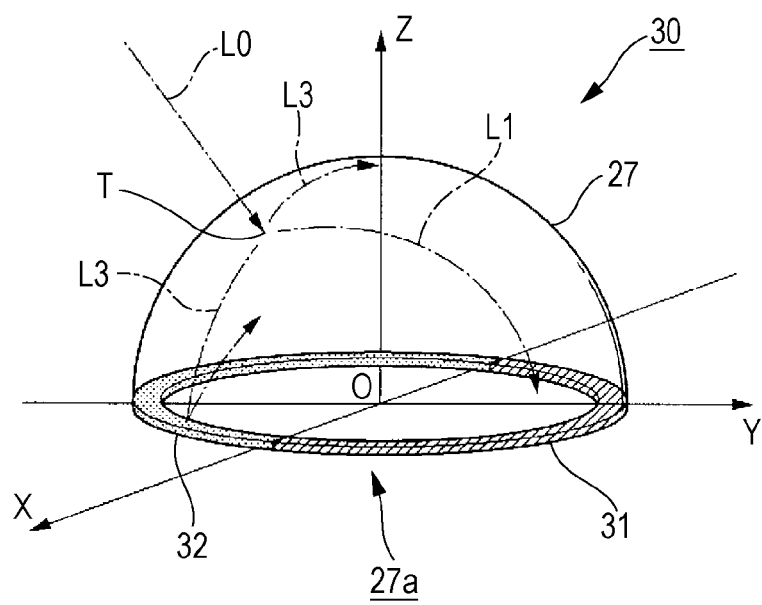
FIG. 10 is a sectional view illustrating a first modification of the solar cell module according to the third embodiment of the present invention.

Instead of such a structure, the solar cell element may be arranged in a part of the end surface of the hemispherical light guide body. In a solar cell module 30 illustrated in FIG. 10, for example, a solar cell element 31 is arranged in a portion corresponding to ½ of the end surface of the hemispherical light guide body 27, and a reflecting portion 32 is formed in a portion corresponding to the remaining ½ of the end surface. The reflecting portion 32 is provided by forming, e.g., a metal film having a high optical reflectance on the end surface of the light guide body 27. More specifically, the reflecting portion 32 may be provided by forming a metal film made of aluminum or silver, for example, on the end surface of the light guide body 27 with, e.g., vapor deposition, or by forming a dielectric multilayer film made of silicon oxide/titanium oxide, for example, on the same. In addition, the reflecting portion 32 may have a smooth surface or an uneven surface. However, when the reflecting portion 32 has an uneven surface, it is desired, from the viewpoint of avoiding leakage of the light from the light guide body 27, that there are no irregularities extending in directions parallel to the inner and outer surfaces of the light guide body 27.

In the solar cell module 30 of this modification, part of the fluorescent light L1 emitted from the phosphor layer (not illustrated), the part propagating in directions toward the solar cell element 31 from a light emission point T, is directly received by the solar cell element 31. On the other hand, fluorescent light L3 propagating in directions toward the reflecting portion 32 from the light emission point T is reflected by the reflecting portion 32, then travels in directions toward the solar cell element 31, and is received by the solar cell element 31. Thus, almost all of the fluorescent lights L1 and L3 propagating in any directions from the light emission point T are finally received by the solar cell element 31. With the solar cell module 30 of this modification, an amount of the solar cell element 31 to be used can be reduced, and cost reduction can be realized.

Second Modification of Third Embodiment

Figure 11:
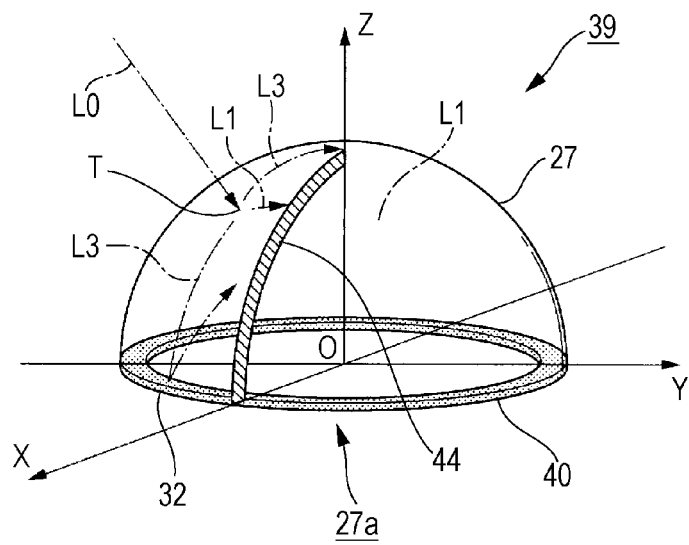
FIG. 11 is a sectional view illustrating a second modification of the solar cell module according to the third embodiment of the present invention.

In the first modification described above, as illustrated in FIG. 10, the solar cell element 31 is arranged in the portion corresponding to ½ of the end surface of the hemispherical light guide body 27, and the reflecting portion 32 is formed in the portion corresponding to the remaining ½ of the end surface. Instead of such a structure, in a solar cell module 39 illustrated in FIG. 11, a reflecting portion 40 is formed at the end surface of the hemispherical light guide body 27 over an entire circumference. The reflecting portion 40 can be formed of a metal film or a dielectric multilayer film as in the first modification described above. In FIG. 11, the reflecting portion 40 is positioned on an xy-plane defined in FIG. 11. Furthermore, a solar cell element 44 is arranged in a portion corresponding to ½ of a semicircle that is a sectional shape resulting when cutting the light guide body 27 in an xz-plane. As in the embodiments described above, the solar cell element 44 may be embedded in the light guide body 27 or may be installed on an outer surface or an inner surface of the light guide body 27.

Also in the second modification, fluorescent light L1 propagating in directions toward the solar cell element 44 from a light emission point T is directly received by the solar cell element 44. Fluorescent light L3 propagating in directions toward the reflecting portion 40 from the light emission point T is reflected by the reflecting portion 40 and then received by the solar cell element 40. According to the solar cell module 39 of the second modification, since the size of the solar cell element 44 is substantially ½ of that in the solar cell module 30 of the first modification, the light collection efficiency can be further increased, and further cost reduction can be realized.

Fourth Embodiment

A fourth embodiment of the present invention will be described below with reference to FIG. 12.

A solar cell module according to the fourth embodiment is similar in basic structure to that in the third embodiment, and is different from the third embodiment just in including a plurality of light guide bodies.

Figure 12:
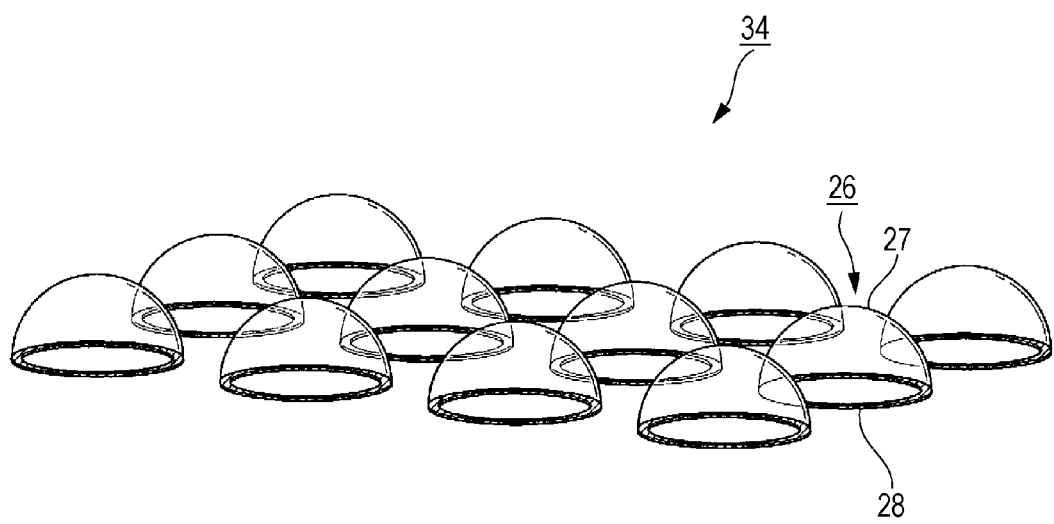
FIG. 12 is a perspective view of a solar cell module according to a fourth embodiment of the present invention.

FIG. 12 is a perspective view of the solar cell module according to the fourth embodiment.

In a solar cell module array 34 according to the fourth embodiment, as illustrated in FIG. 12, the solar cell module 26 including the solar cell element 28 disposed at the end surface of the hemispherical light guide body 27 is arranged plural number in an array form. The plural solar cell modules 26 may be arrayed in a lattice pattern or arrayed in plural rows with a shift of a half pitch per row.

The fourth embodiment can also provide, in each of the solar cell modules 26, similar advantageous effects to those in the first to third embodiments, i.e., such capabilities as realizing the solar cell module with high light collection efficiency, suppressing the variations in power generation output, reducing the weight and the cost of the solar cell module, and improving the degree of freedom in selecting the installed position of the solar cell module. Moreover, in the solar cell module array 34, since the plural solar cell modules 26 are collectively disposed, the total power generation output can be increased.

Fifth Embodiment

A fifth embodiment of the present invention will be described below with reference to FIGS. 13, 14A and 14B.

A solar cell module according to the fifth embodiment is similar in basic structure to that in the first embodiment, and is different from the first embodiment just in shape of the light guide body.

Figure 13:
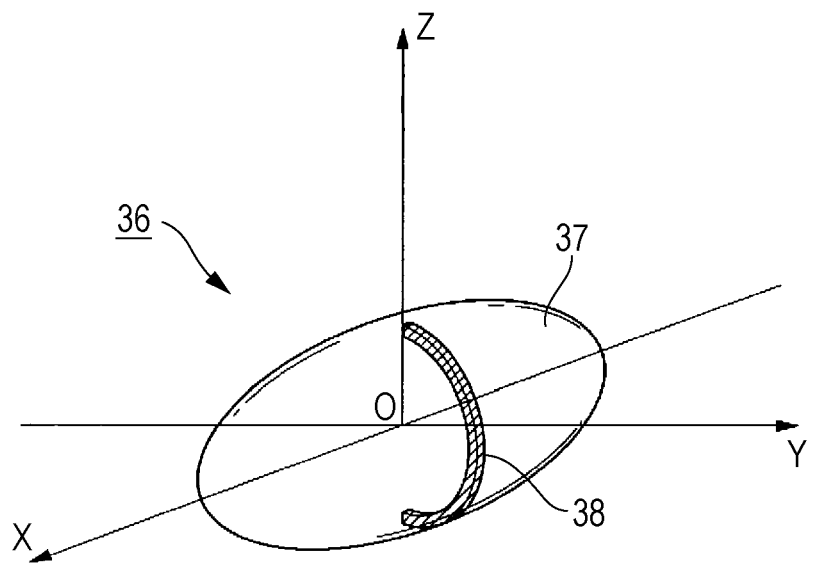
FIG. 13 is a perspective view of a solar cell module according to a fifth embodiment of the present invention.
Figure 14A:
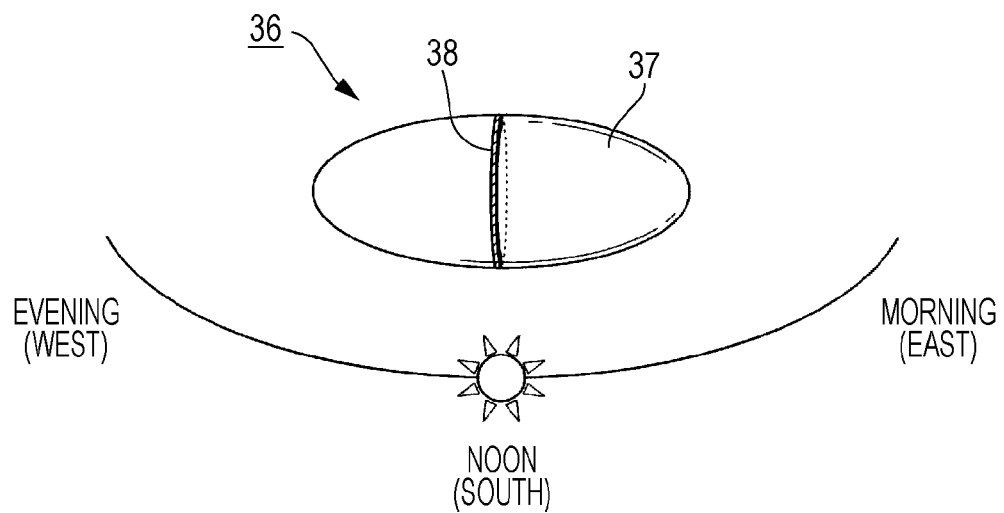
FIG. 14A illustrates usage of the solar cell module according to the fifth embodiment of the present invention.

FIG. 13 is a perspective view of the solar cell module according to the fifth embodiment. FIGS. 14A and 14B illustrate usage of the solar cell module according to the fifth embodiment.

A solar cell module 36 according to the fifth embodiment includes, as illustrated in FIG. 13, a light guide body 37 and a solar cell element 38. The light guide body 37 is made of a light-transmissive base material and is constituted as a shell-like elliptical body (structural body) of which inner side is an enclosed space. The elliptical body constituting the light guide body 37 is a spheroid that is obtained by rotating an ellipse, having an x-axis as a major axis, about the x-axis as a center. In FIG. 13, therefore, a sectional shape resulting from cutting the light guide body 37 along an xy-plane or an xz-plane is an ellipse, and a sectional shape resulting from cutting the light guide body 37 along a yz-plane is a circle.

However, the elliptical body is not always required to be the spheroid, and sectional shapes resulting from cutting the light guide body 37 along three planes may be all ellipses.

The solar cell element 38 is arranged in a portion corresponding to ½ of the circumference of a circle that is formed by intersection of a plane (yz-plane), which passes a center O of the elliptical body constituting the light guide body 37 and which is perpendicular to an axis of rotational symmetry, and the surface of the elliptical body. Thus, the solar cell element 38 has a shape of one of halves obtained by dividing a circular ring. Stated in another way, the solar cell element 38 is arranged in one of sectional surfaces, resulting from cutting the light guide body 37 along various planes passing the center O of the elliptical body, in which a cross-sectional area of the light guide body 37 is minimal. The solar cell element 38 is embedded within the light guide body 37 in the plane (yz-plane) passing the center of the elliptical body. The other structure is the same as that in the first embodiment.

When the light guide body 37 is the elliptical body, the light receiving area increases in comparison with the case where the light guide body is the spherical body, in spite of an area of the solar cell element 38 being the same. Therefore, the solar cell module 36 with a higher power generation output can be realized with a lower cost.

In the case of the solar cell module 1 including the spherical light guide body 2 according to the first embodiment, the figure resulting from projecting the light guide body 2 is always a circle regardless of direction, and an area of the projected circle does not change. In contrast, in the case of the solar cell module 36 according to the fifth embodiment, a figure resulting from projecting the light guide body 37 changes between an ellipse and a circle depending on direction, and an area of the projected figure also changes correspondingly. In the solar cell module 36 according to the fifth embodiment, therefore, variations in power generation output depending on the position of the sun are larger than those in the solar cell modules, each including the spherical light guide body 2, according to the first and second embodiments.

Conversely thinking, the power generation output can be changed in the morning and the evening in a day by installing the solar cell module 36 in a different posture with respect to the position of the sun. In the case of the northern hemisphere, for example, the solar cell module is assumed to be installed, as illustrated in FIG. 14A, in such a posture that the major axis of the light guide body 37 is oriented to be substantially in the east-and-west direction (i.e., opposite ends of the major axis of the light guide body 37 are positioned to be substantially in match with the east-and-west direction), and the major axis of the light guide body 37 extends horizontally. In such a case, when the sun culminates at the noon, the light receiving area of the light guide body 37 is maximized, and when the sun declines in the morning and the evening, the light receiving area of the light guide body 37 is reduced. Accordingly, a maximum power generation output can be obtained at the noon.

Figure 14B:
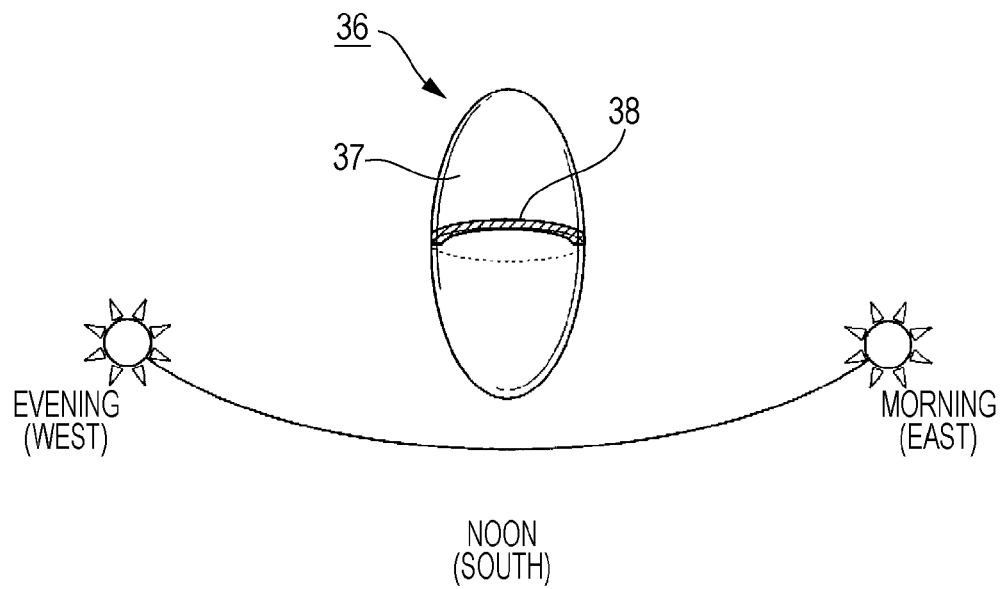
FIG. 14B illustrates usage of the solar cell module according to the fifth embodiment of the present invention.

On the other hand, the solar cell module 36 is assumed to be installed, as illustrated in FIG. 14B, in such a posture that the major axis of the light guide body 37 is oriented to be substantially in the south direction (i.e., the opposite ends of the major axis of the light guide body 37 are positioned to be substantially in match with the south-and-north direction), and the major axis of the light guide body 37 is raised from the horizontal direction by a predetermined angle (e.g., 30 degrees to 80 degrees). In such a case, when the sun culminates at the noon, the light receiving area of the light guide body 37 is minimized, and when the sun declines in the morning and the evening, the light receiving area of the light guide body 37 is increased. Accordingly, the power generation output can be increased in the morning and the evening. Thus, the power generation output of the solar cell module 36 can be optimized depending on the situation in use of electric power in a day.

Alternatively, the light guide body 37 may be constituted to be rotatable about an axis passing the center of the elliptical body (e.g., a y-axis or a z-axis in FIG. 13) except for the axis of rotational symmetry (i.e., an x-axis in FIG. 13) of the elliptical body constituting the light guide body 37. When installing the solar cell module 36 in such a case, a rotation axis of the light guide body 37 is oriented in the south-and-north direction such that the major axis (x-axis in FIG. 13) of the light guide body 37 can be rotated in the east-and-west direction. Moreover, by adding a tracking device to the solar cell module 36, the light guide body 37 can be controlled to follow the motion of the sun such that one of ellipses as projected shapes of the light guide body 37, the one having a maximum area, is always directed to the sun. With such an arrangement, because the light receiving area of the light guide body 37 is always maximized, a total power generation output through a day can be maximized. In addition, since the light guide body 37 needs to be rotated just about one rotation axis and the light guide body 37 is light-weight, a relatively cheap tracking device can be used.

Sixth Embodiment

A sixth embodiment of the present invention will be described below with reference to FIGS. 15 and 16.

A solar cell module according to the sixth embodiment is similar in basic structure to that in the first embodiment, and is different from the first embodiment in shape of the light guide body.

Figure 15:
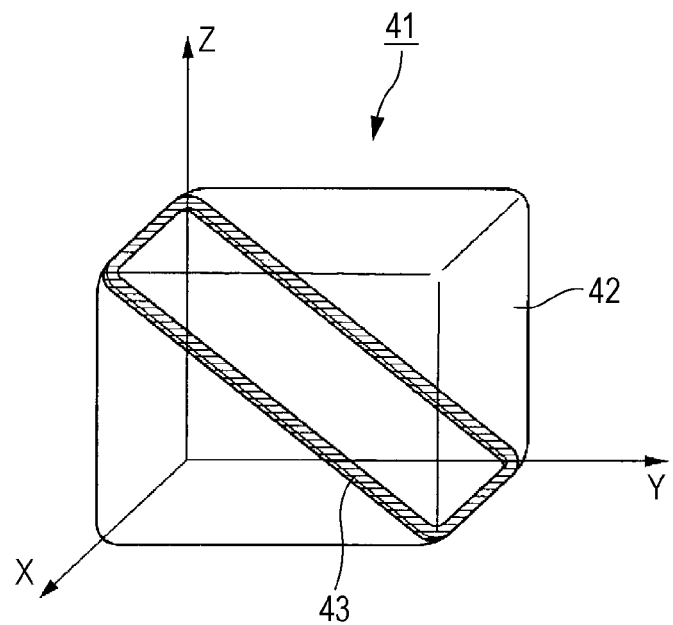
FIG. 15 is a perspective view of a solar cell module according to a sixth embodiment of the present invention.

FIG. 15 is a perspective view of the solar cell module according to the sixth embodiment. FIG. 16 is an enlarged view of a part of the solar cell module illustrated in FIG. 15.

A solar cell module 41 according to the sixth embodiment includes, as illustrated in FIG. 15, a light guide body 42 and a solar cell element 43. The first embodiment has been described in connection with an example using the spherical light guide body 2, and the fifth embodiment has been described in connection with an example using the elliptical light guide body 37. In contrast, a light guide body 42 according to the sixth embodiment is constituted by a cubic body (structural body) of which inner side is an enclosed space. In FIG. 15, three edges of the cubic body, which are orthogonal to one another, are drawn as being aligned with an x-axis, a y-axis, and a z-axis, respectively. However, all edges at which, of six surfaces of the cubic body, two orthogonal surfaces are contacted with each other, and all corners at which three orthogonal surfaces are contacted with one another are rounded at a predetermined curvature radius without being sharply angled.

It is to be noted that the shape of the light guide body 42 is not limited to a hollow cubic, and it may be a hollow rectangular parallelepiped.

The solar cell element 43 is arranged along respective diagonal lines of opposed two of six surfaces of the cubic body constituting the light guide body 42, and along edges each interconnecting the ends of the diagonal lines on the same side. Accordingly, the solar cell element 43 has a rectangular ring-like shape. Furthermore, the solar cell element 43 is embedded within the light guide body 42 in a plane including the above-mentioned two diagonal lines. The other structure is the same as that in the first embodiment.

Figure 16:
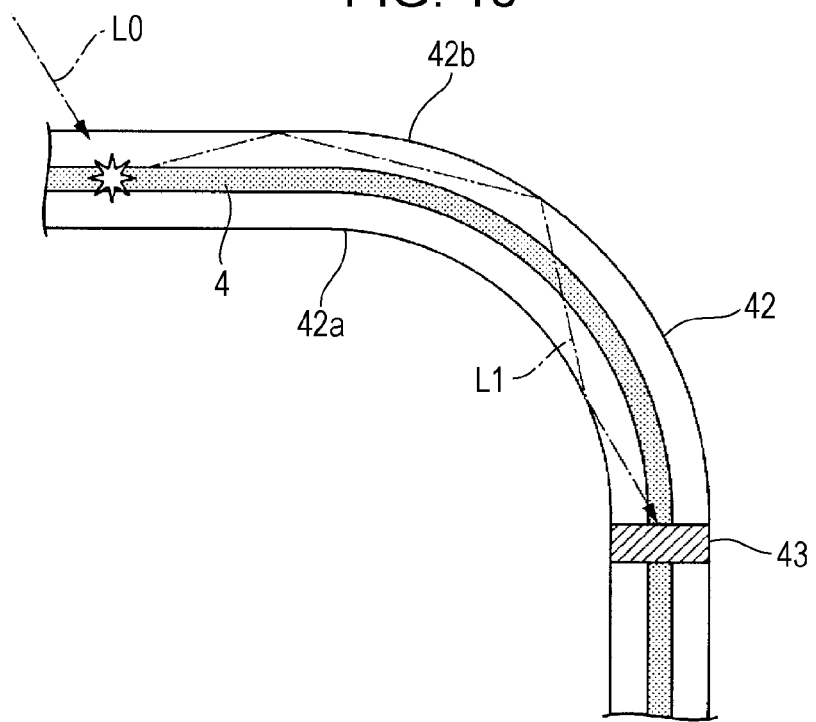
FIG. 16 is a sectional view of a part of the solar cell module according to the sixth embodiment of the present invention.

Also in the solar cell module 41 according to the sixth embodiment, as illustrated in FIG. 16, the fluorescent light L1 emitted from the phosphor layer 4 is guided to propagate within the light guide body 42 while repeating total reflection between an inner surface 42a and an outer surface 42b of the light guide body 42, as in the solar cell modules according to the first to fifth embodiments. In the case of the light guide body 42 being a body having corners, such as a cube or a rectangular parallelepiped, if the corners are sharply angled, light incident on a corner portion does not satisfy the total reflection condition, and there is a possibility that the light may leak to the outside of the light guide body 42. Accordingly, the corners of the light guide body 42 are required to have such a curvature radius as allowing the light to be guided within the light guide body 42 through total reflection.

The sixth embodiment can also provide similar advantageous effects to those in the first to fifth embodiments, i.e., such capabilities as realizing the solar cell module with high light collection efficiency, suppressing the variations in power generation output, reducing the weight and the cost of the solar cell module, and improving the degree of freedom in selecting the installed position of the solar cell module. It is to be noted that the shape of the light guide body 42 is not limited to the hollow cube or rectangular parallelepiped, and the light guide body 42 may have another hollow body shape insofar as corner portions have a certain curvature radius as described above. For example, the light guide body may be designed in a shape exhibiting an advertisement effect. Additionally, the solar cell module of the type according to the sixth embodiment may be arranged in plural number in an array form.

First Modification of Sixth Embodiment

In the sixth embodiment, the solar cell element 43 is not always required to be arranged along respective diagonal lines of opposed two of six surfaces of the cubic body constituting the light guide body 42. The solar cell element may be arranged in various forms. However, for example, when a solar cell element 45 is arranged parallel to one edge of the cubic body constituting the light guide body 42 like a solar cell module 46 illustrated in FIG. 18, the fluorescent light L1 emitted from the light emission point T in the phosphor layer and guided to propagate parallel to the one edge of the cubic body cannot reach the solar cell element 45. Accordingly, the light collection efficiency is reduced.

Figure 17:
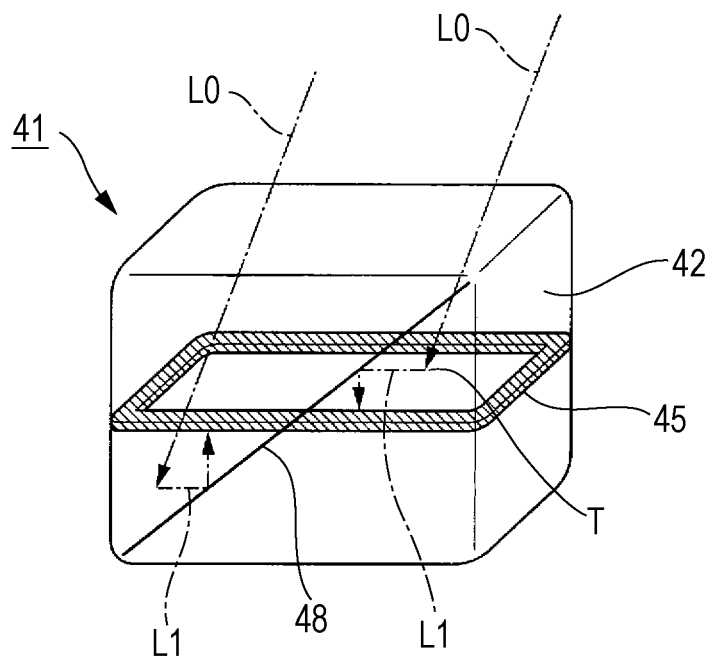
FIG. 17 is a perspective view illustrating a first modification of the solar cell module according to the sixth embodiment of the present invention.
Figure 18:
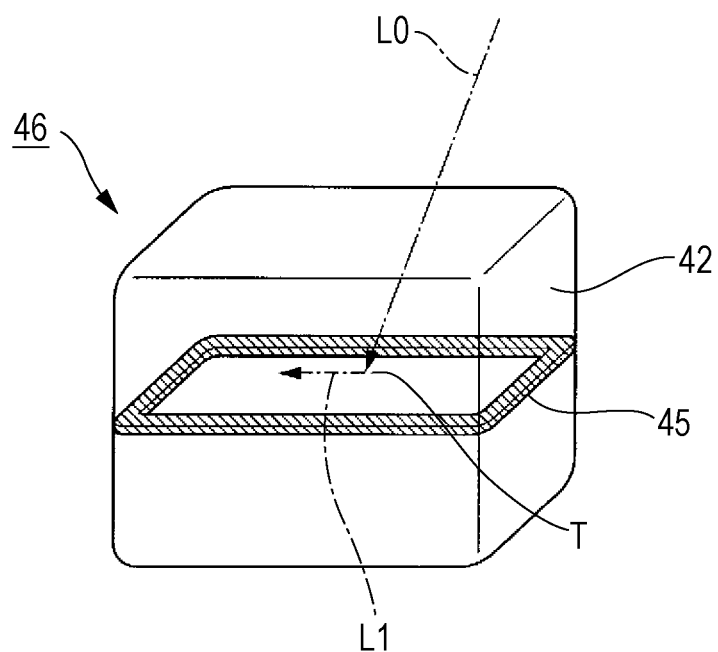
FIG. 18 is a perspective view of a solar cell module as a comparative example.

To cope with the above-mentioned point, when the solar cell element 45 is arranged parallel to one edge of the cubic body constituting the light guide body 42, a reflecting portion 48 is arranged to lie on a diagonal line of one surface of the light guide body 42 in crossing relation to the solar cell element 45 as in a solar cell module 47 illustrated in FIG. 17. The reflecting portion 48 can be formed of a metal film or a dielectric multilayer film similarly to the reflecting portion 25 described in the first modification of the second embodiment (see FIG. 8). In the case of the reflecting portion 48 being provided in crossing relation to the solar cell element 45, because the fluorescent light L1 guided to propagate parallel to the one edge of the cubic body obliquely enters the reflecting portion 48, the propagating direction of the light is changed in a direction crossing the one edge of the cubic body. As a result, the fluorescent light L1 can reach the solar cell element 45. Thus, the reduction of the light collection efficiency resulting in the case of arranging the solar cell element 45 as illustrated in FIG. 18 can be compensated for by providing the reflecting portion 48 as illustrated in FIG. 17.

Seventh Embodiment

A seventh embodiment of the present invention will be described below with reference to FIGS. 19 to 21.

While the phosphor is included in the light guide body in each of the solar cell modules according to the first to sixth embodiments, a solar cell module according to the seventh embodiment is different in that the phosphor is not included in the light guide body.

Figure 19:
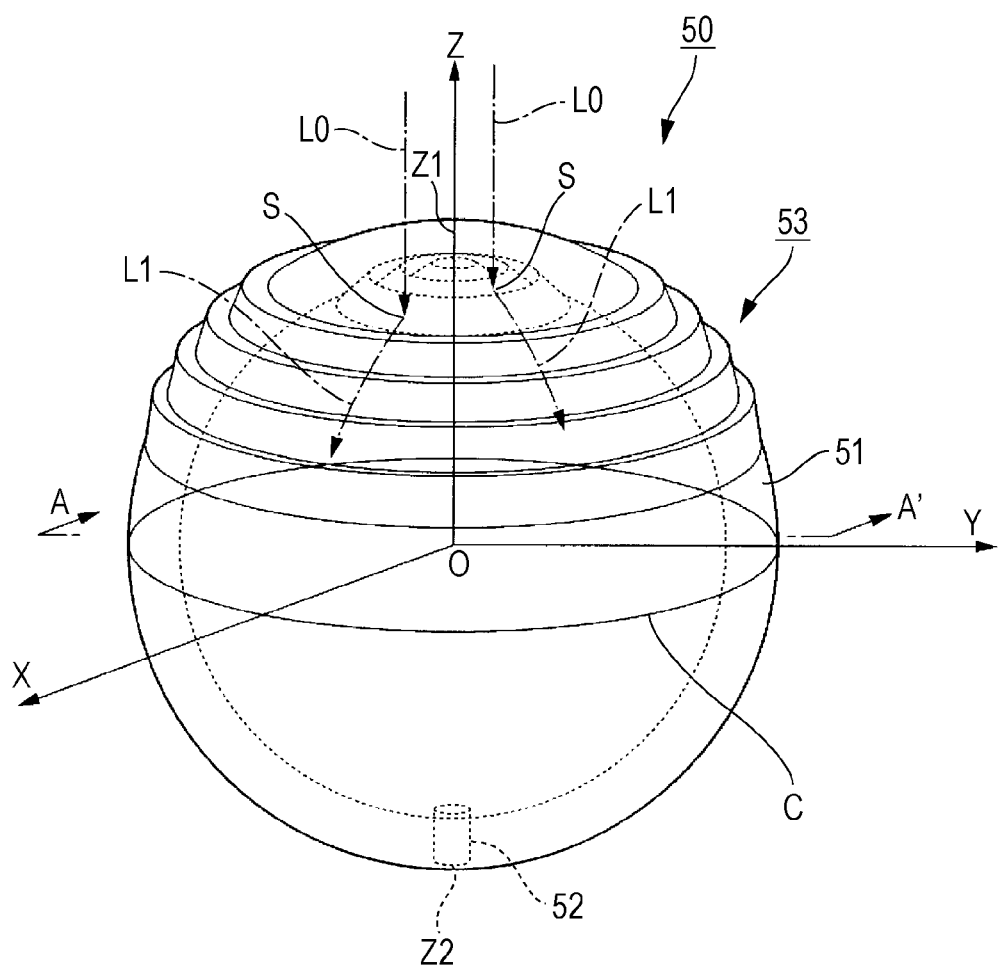
FIG. 19 is a perspective view of a solar cell module according to a seventh embodiment of the present invention.
Figure 20:
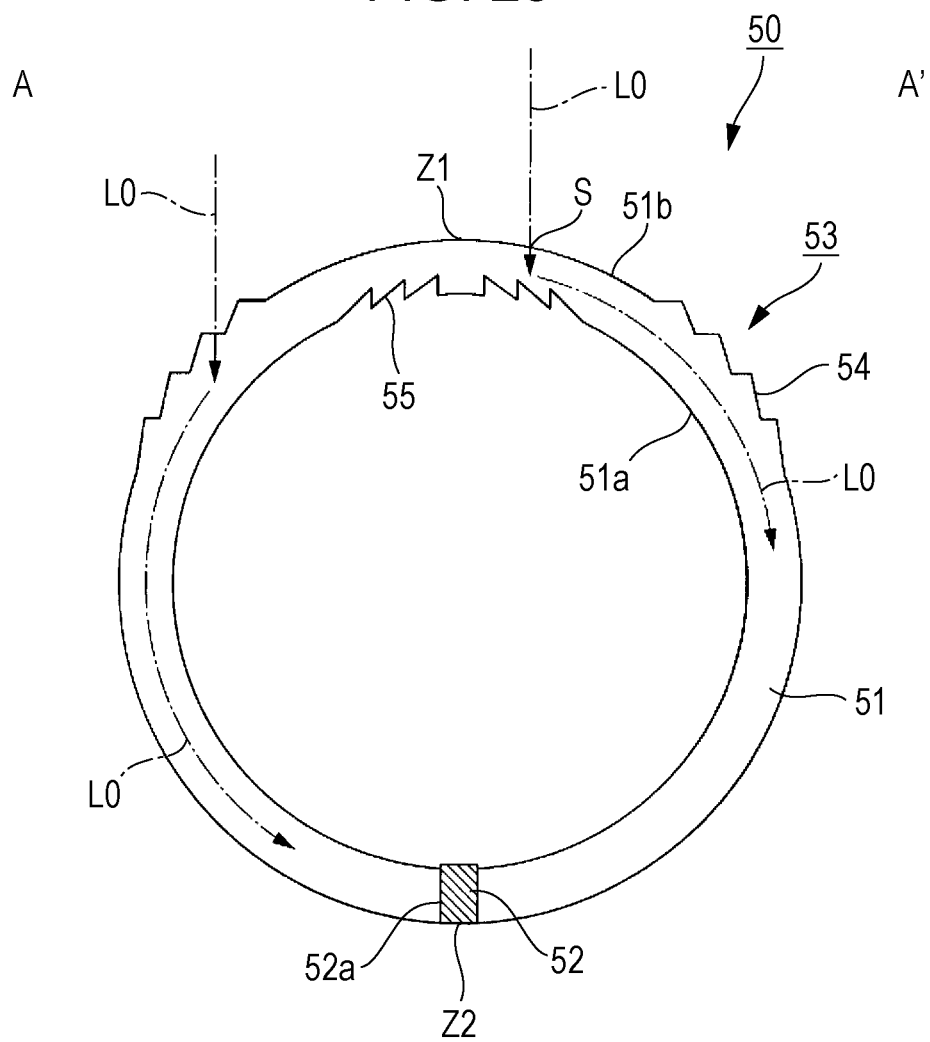
FIG. 20 is a sectional view of the solar cell module according to the seventh embodiment of the present invention.

FIG. 19 is a perspective view of the solar cell module according to the seventh embodiment. FIG. 20 is a sectional view taken along a line A-A' in FIG. 19. FIG. 21 is an enlarged view of a part of the solar cell module illustrated in FIG. 20.

A solar cell module 50 according to the seventh embodiment includes, as illustrated in FIG. 19, a light guide body 51 and a solar cell element 52. The light guide body 51 is constituted by a shell-like spherical body (structural body) of which inner side is an enclosed space. The following description is made on the premise that, as illustrated in FIG. 19, three axes passing a center O of the spherical body and being orthogonal to one another are defined as an x-axis, a y-axis, and a z-axis, respectively. In addition, for the sake of convenience in explanation, a circle C formed by intersection of an xy-plane including the center O of the spherical body and the surface of the spherical body is called a "maximum circle". Of two points on the spherical body farthest away from the center of the spherical body along the z-axis, a point Z1 on the upper side (+z side) is called an "uppermost point", and a point Z2 on the lower side (−z side) is called a "lowermost point". Of the spherical body, a portion on the side above the xy-plane is called an "upper hemisphere", and a portion on the side under the xy-plane is called a "lower hemisphere".

Of the spherical body constituting the light guide body 51, the upper hemisphere includes an uneven portion 53 having a reflecting surface that reflects the outside light L0 input through an outer surface of the light guide body 51 to change the propagating direction of the light. As illustrated in FIGS. 20 and 21, the uneven portion 53 is constituted by a plurality of ridges 54, which are formed in an outer surface 51b of the light guide body 51 and which have triangular sectional shapes, and by a plurality of grooves 55, which are formed in an inner surface 51a of the light guide body 51 and which have triangular sectional shapes. The ridges 54 and the grooves 55 are formed to extend parallel to the xy-plane. All the ridges 54 and the grooves 55 are formed in concentric relation with the z-axis being a center.

The uneven portion 53 can be formed, for example, by cutting the inner surface 51a and the outer surface 51b of the light guide body 51. Alternatively, the uneven portion 53 can be formed, as another example, by a method of injection-molding a resin with a metal mold having a concave shape resulting from reversing the shape of the ridge 54 and a convex shape resulting from reversing the shape of the grooves 55.

Of the spherical body constituting the light guide body 51, the lower hemisphere has a smooth curved surface without including an uneven portion like the above-described uneven portion 53. The solar cell element 52 having a cylindrical shape, for example, is disposed at the lowermost point Z2 of the spherical body. As illustrated in FIG. 20, the solar cell element 52 is embedded in the light guide body 51 on the z-axis passing the center O of the spherical body. A lateral surface 52a of the solar cell element 52, the lateral surface 52a contacting with the light guide body 51, serves as a light receiving surface.

Figure 21:
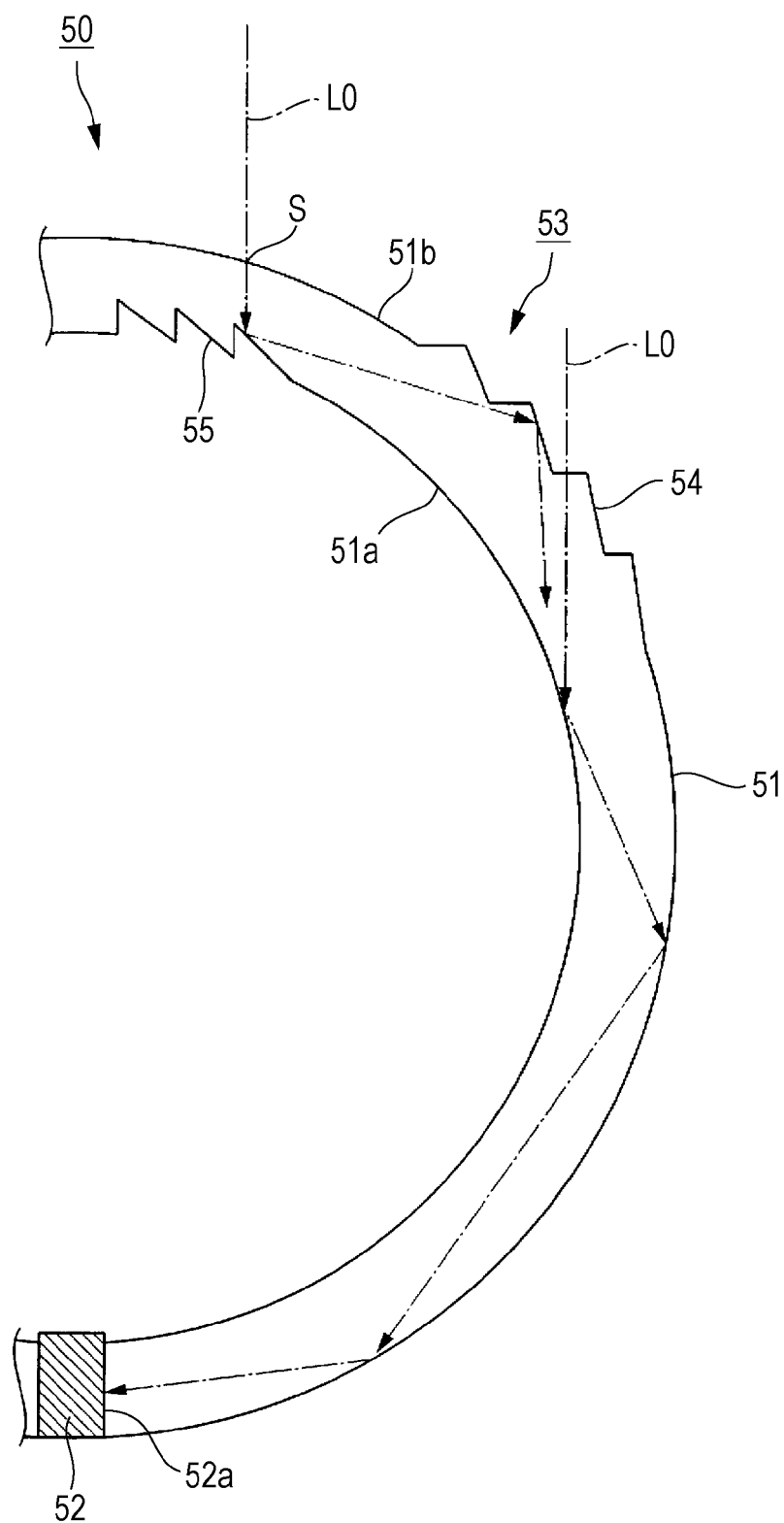
FIG. 21 is an enlarged view of a part of FIG. 20.

While the ridges 54 and the grooves 55 both constituting the uneven portion 53 have the triangular sectional shapes as described above, angles formed by adjacent surfaces of the ridges 54 and the grooves 55 are different depending on a position on the light guide body 51, as illustrated in FIG. 21. It is assumed that when the sun is now positioned on the upper sphere side of the light guide body 51. In such a case, after entering an incident point S on the outer surface 51b of the upper sphere of the light guide body 51, the outside light L0 is totally reflected by one surface of the groove 55, which is formed in the inner surface 51a of the light guide body 51, to change its propagating direction obliquely downwards, and is guided to propagate from the upper sphere toward the lower sphere while repeating total reflection between the outer surface 51b of the light guide body 51 or one surface of the ridge 54 and the inner surface 51a of the light guide body 51. Thereafter, the outside light L0 reaches the solar cell element 52 disposed at the lowermost point Z2, and it is received at the light receiving surface 52a. Thus, the outside light L0 is guided to propagate through a path extending substantially along the circumference of a circle that is formed by intersection of a plane passing the incident point S and the lowermost point Z2 on the light guide body 51 and the surface of the light guide body 51, and is received by the solar cell element 52.

In the solar cell modules according to the first to sixth embodiments, the solar cell element receives the fluorescent light emitted from the phosphor upon receiving, as excitation light, the sunlight input to the light guide body, and the emitted fluorescent light is converted to electrical energy. In contrast, in the solar cell module 50 according to the seventh embodiment, the solar cell element 52 receives the outside light L0 (sunlight), which has entered the light guide body 51 and which has been guided to propagate within the light guide body 51, and then converts the received outside light to electrical energy.

The seventh embodiment can also provide similar advantageous effects to those in the first to sixth embodiments, i.e., such capabilities as realizing the solar cell module with high light collection efficiency, reducing the weight and the cost of the solar cell module, and improving the degree of freedom in selecting the installed position of the solar cell module. In the seventh embodiment, particularly, the solar cell element 52 is just required to be arranged in a point-like form at the lowermost point Z2, and is not required to be arranged in a long linear form unlike the first to fifth embodiments. Therefore, the light collection efficiency per unit area of the solar cell element 52 can be increased.

First Modification of Seventh Embodiment

Figure 22:
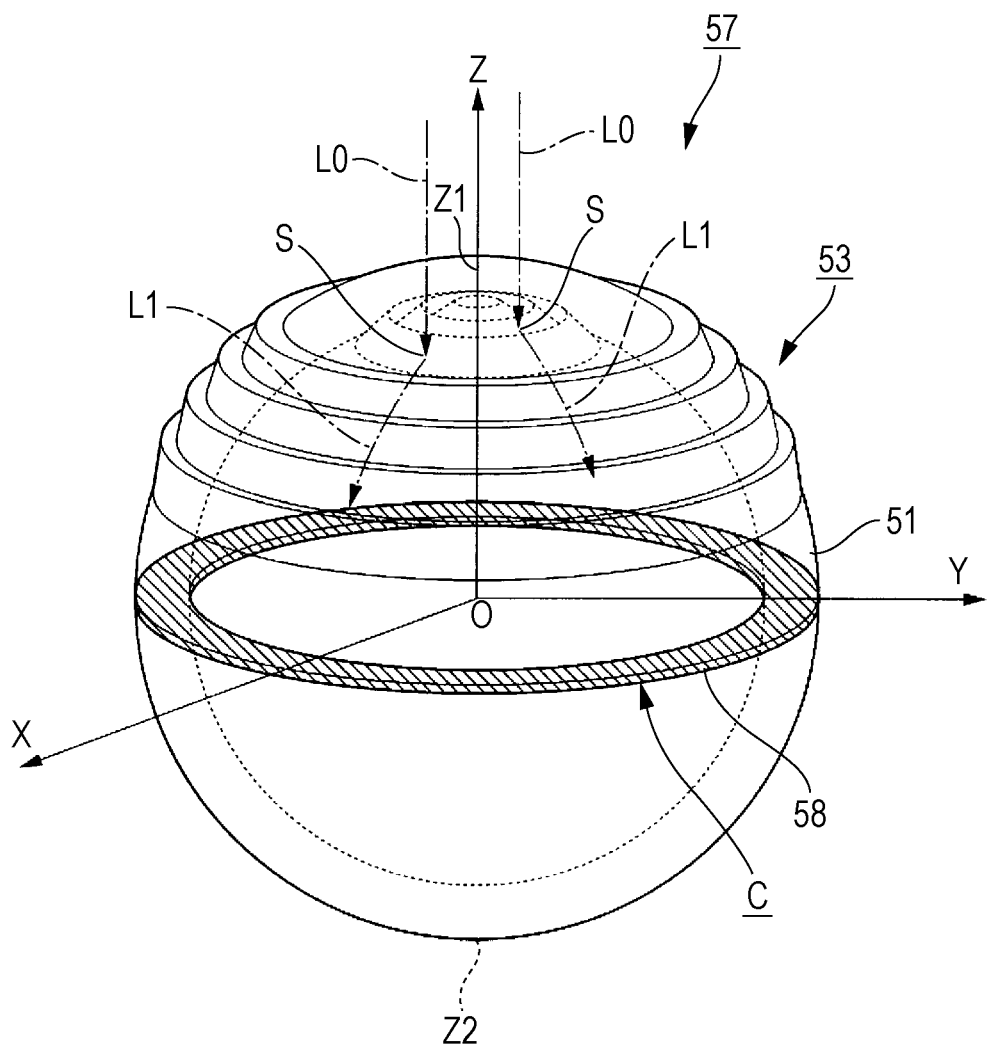
FIG. 22 is a sectional view illustrating a first modification of the solar cell module according to the seventh embodiment of the present invention.

In the seventh embodiment, the solar cell element 52 is disposed at the lowermost point of the sphere constituting the light guide body 51. In such a case, when the position of the sun relative to the light guide body 51 changes, a position where the sunlight is condensed after entering the light guide body 51 also changes. Hence the light collection efficiency of the solar cell element 52 reduces. In contrast, in a solar cell module 57 of a first modification, a solar cell element 58 is arranged over the entire circumference of the maximum circle C of the light guide body 51, as illustrated in FIG. 22.

With the arrangement described above, since the solar cell element 58 is arranged along the maximum circle C of the light guide body 51, variations in the light collection efficiency depending on changes in the position of the sun can be suppressed to some extent. It is to be noted that, in the solar cell module 57 of the first modification, since the light incident on the upper hemisphere is received by the solar cell element 58 arranged along the maximum circle C of the light guide body 51, the light guide body on the lower hemisphere side may be dispensed with.

Second Modification of Seventh Embodiment

Figure 23:
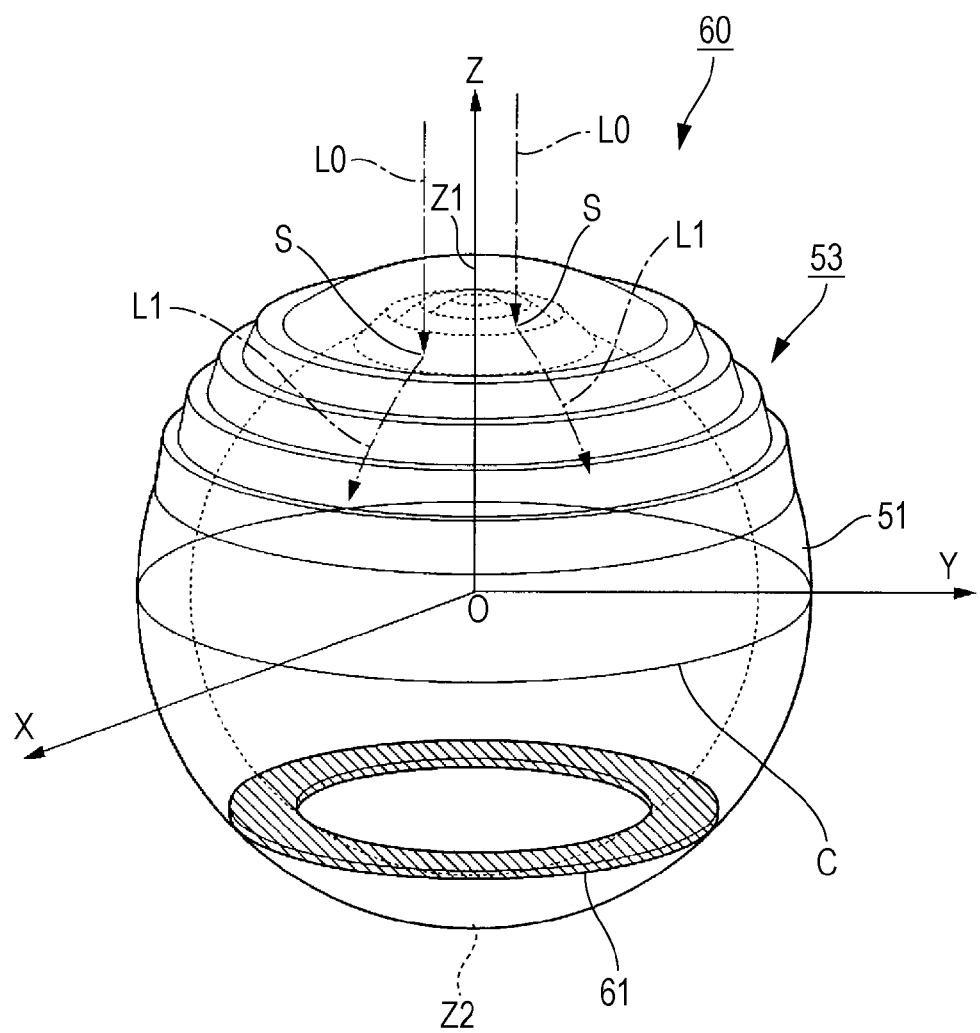
FIG. 23 is a sectional view illustrating a second modification of the solar cell module according to the seventh embodiment of the present invention.

In the above-described solar cell module 57 of the first modification, because an area of the solar cell element 58 increases in comparison with that in the seventh embodiment, the manufacturing cost also increases. To cope with such a point, in a solar cell module 60 of a second modification, a solar cell element 61 is arranged, as illustrated in FIG. 23, over the circumference of a circle that is formed by intersection of a plane, which is parallel to the xy-plane and which is positioned between the maximum circle C of the spherical body 51 and the lowermost point Z2, and the surface of the spherical body.

With the arrangement described above, an increase of the area of the solar cell element can be suppressed while the variations in the light collection efficiency depending on changes in the position of the sun are suppressed.

Third Modification of Seventh Embodiment

Figure 24:
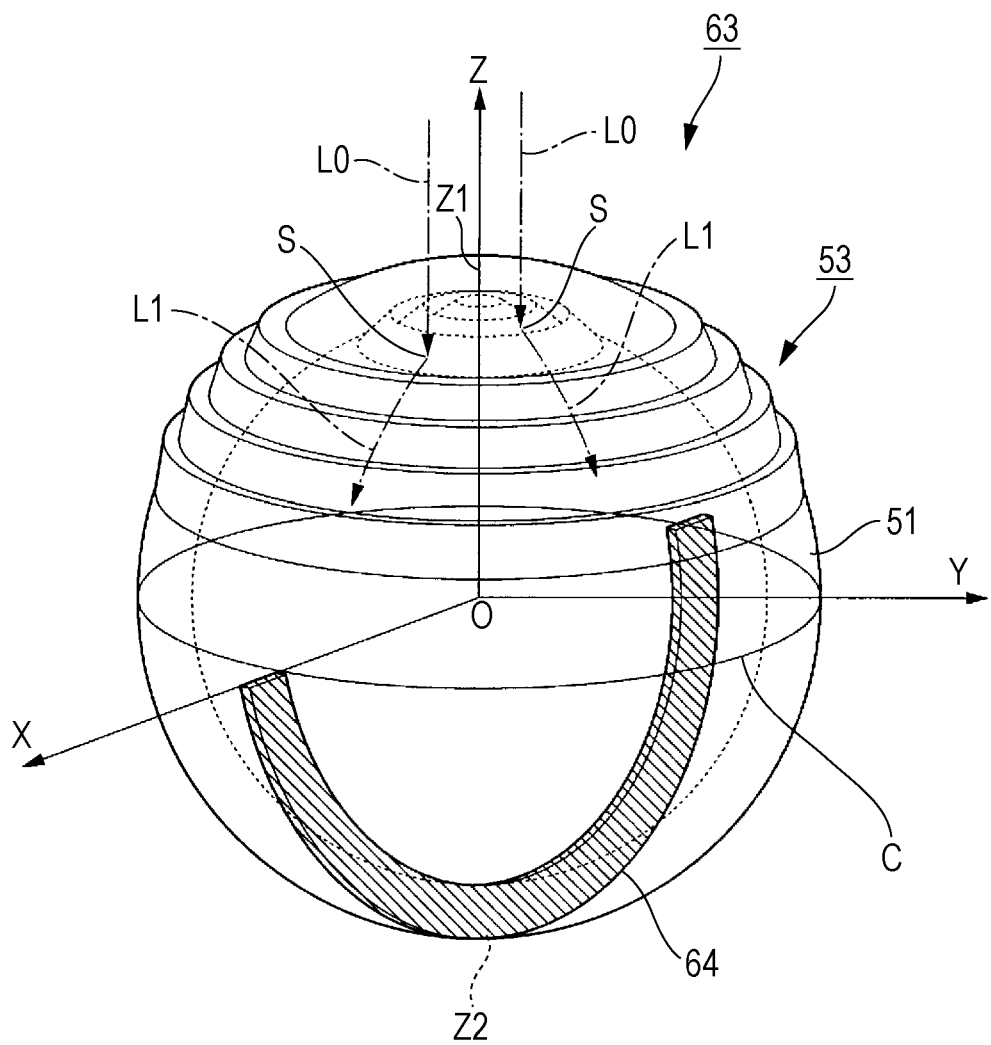
FIG. 24 is a sectional view illustrating a third modification of the solar cell module according to the seventh embodiment of the present invention.

In a solar cell module 63 of a third modification, as illustrated in FIG. 24, a solar cell element 64 is arranged in a portion of the circumference of a circle that is formed by intersection of an xz-plane passing the center O of the spherical body constituting the light guide body 51 and the surface of the spherical body, the portion being positioned on the lower hemisphere side. The solar cell module 63 of the third modification can also provide similar advantageous effects to those in the seventh embodiment.

Eighth Embodiment

An eighth embodiment of the present invention will be described below with reference to FIG. 25.

A solar cell module according to the eighth embodiment is similar in basic structure to that in the first embodiment, and is different from the first embodiment in including a protective member.

Figure 25:
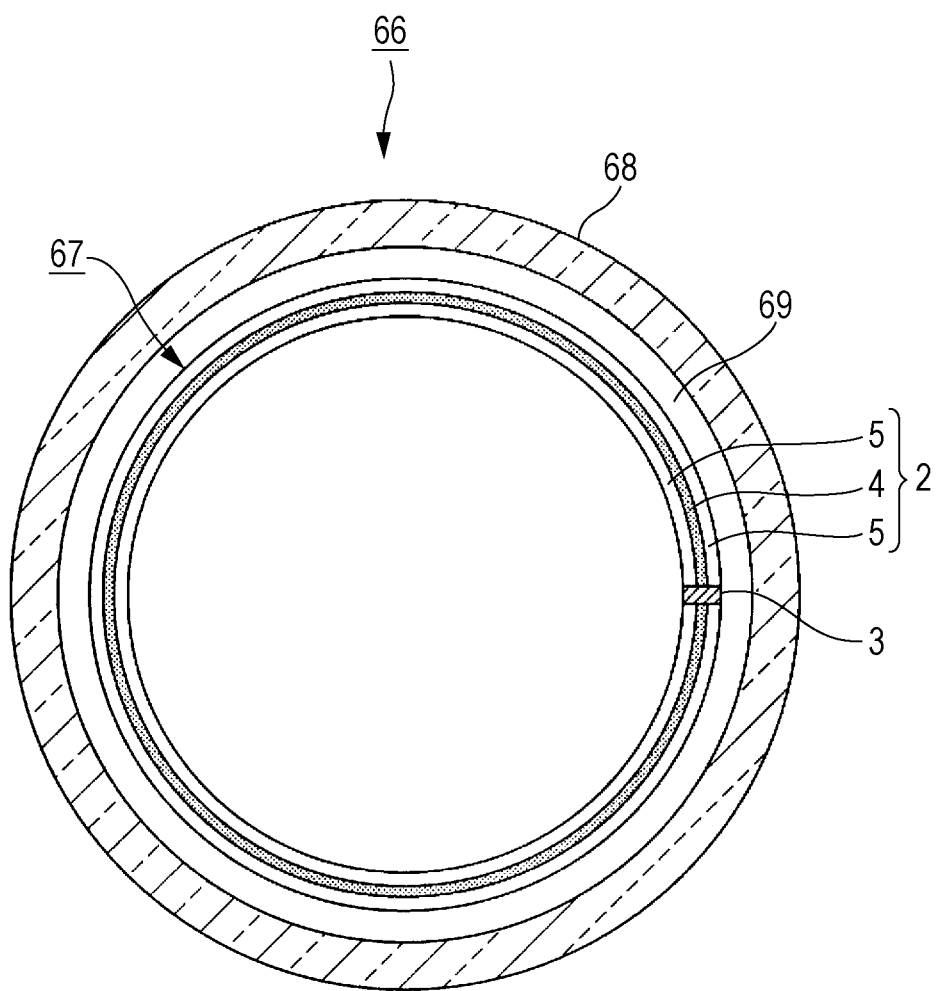
FIG. 25 is a sectional view of a solar cell module according to an eighth embodiment of the present invention.

FIG. 25 is a sectional view of the solar cell module according to the eighth embodiment. It is to be noted that, in FIG. 25, common components to those in FIG. 2 representing the first embodiment are denoted by the same reference signs and description of those common components is omitted.

A solar cell module 66 according to the eighth embodiment includes, as illustrated in FIG. 25, a solar cell module main body 67 and a protective member 68. The solar cell module main body 67 is the same as the solar cell module 1 according to the first embodiment. The protective member 68 is made of a light-transmissive base material and is constituted by a hollow spherical body (structural body) having a larger diameter than the solar cell module main body 67. The protective member 68 is arranged outside the light guide body 2 of the solar cell module main body 67 to cover the light guide body 2 with a spacing kept relative to the light guide body 2.

A space between the light guide body 2 and the protective member 68 needs to be filled with a material having a lower refractive index than the light guide body 2. In the eighth embodiment, air 69 is filled in the space between the light guide body 2 and the protective member 68. Alternatively, the space between the light guide body 2 and the protective member 68 may be held in a vacuum state.

The eighth embodiment can also provide similar advantageous effects to those in the first to seventh embodiments, i.e., such capabilities as realizing the solar cell module with high light collection efficiency, reducing the weight and the cost of the solar cell module, and improving the degree of freedom in selecting the installed position of the solar cell module. In the eighth embodiment, particularly, when the solar cell module 66 is installed outdoor, for example, the light guide body 2 can be protected from pollution attributable to rain, sands, dusts, etc. because the solar cell module main body 67 is covered with the protective member 68. If the surface of the light guide body 2 is polluted, the polluted portion impedes the total reflection of the light, thus reducing the power generation output. In view of such a point, the eighth embodiment can provide the solar cell module 66, which is highly resistant against the pollution attributable to rain, sands, dusts, etc., and which is less likely to cause reduction of the power generation output.

Ninth Embodiment

A ninth embodiment of the present invention will be described below with reference to FIG. 26.

A solar cell module according to the ninth embodiment has a double structure in which the solar cell module of the first embodiment and the solar cell module of the seventh embodiment are combined with each other.

Figure 26:
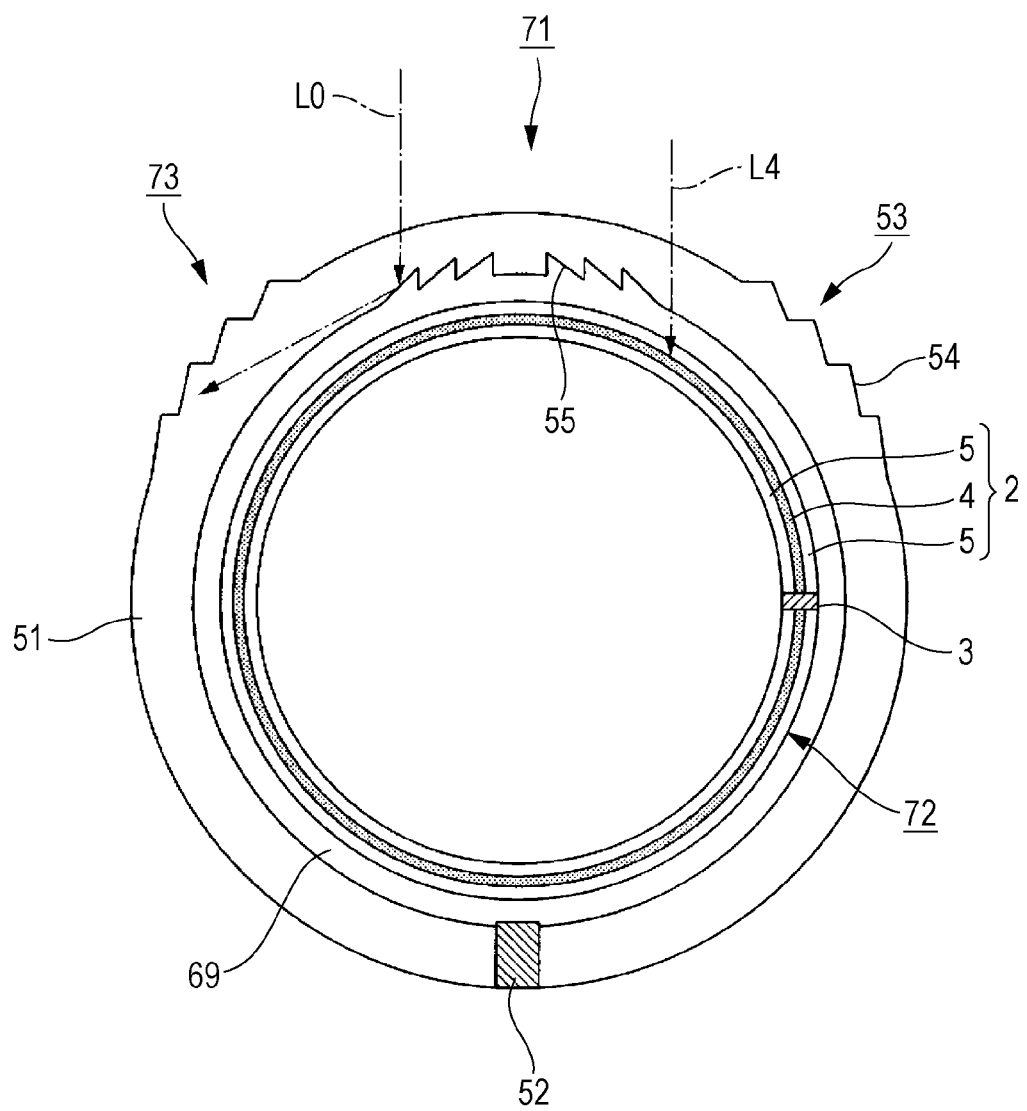
FIG. 26 is a sectional view of a solar cell module according to a ninth embodiment of the present invention.

FIG. 26 is a sectional view of the solar cell module according to the ninth embodiment. It is to be noted that, in FIG. 26, common components to those in FIG. 2 representing the first embodiment and FIG. 20 representing the seventh embodiment are denoted by the same reference signs and description of those common components is omitted.

A solar cell module 71 according to the ninth embodiment includes, as illustrated in FIG. 26, a first solar cell module 72 and a second solar cell module 73. The first solar cell module 72 is the same as the solar cell module 1 according to the first embodiment. The second solar cell module 73 is the same as the solar cell module 50 according to the seventh embodiment. The second solar cell module 73 has a larger diameter than the first solar cell module 72, and it is arranged outside the light guide body 2 of the first solar cell module 72 with a certain spacing kept relative to the light guide body 2. The first solar cell module 72 and the second solar cell module 73 are formed of concentric spherical bodies. Furthermore, air 69 is filled between the first solar cell module 72 and the second solar cell module 73.

In the solar cell module 71 according to the ninth embodiment, the outside light L0 first enters the second solar cell module 73 arranged on the outer side, and is then received by the solar cell element 52 through the light guide body 51. However, as part of the light incident on the second solar cell module 73, there exists outside light L4 that cannot be taken into the light guide body 51 and that passes through the light guide body 51 depending on the incident position or the incident angle in the surface of the light guide body 51. In the case of the ninth embodiment, since the first solar cell module 72 is disposed inside the second solar cell module 73, the light having passed through the second solar cell module 73 enters the first solar cell module 72, and is received by the solar cell element 3 through the light guide body 2. Since the first solar cell module 72 includes the phosphor layer 4 arranged over the entire surface of the light guide body 2, the light having not been captured by the second solar cell module 73 can be efficiently utilized as the excitation light.

Thus, when considering the first solar cell module 72 and the second solar cell module 73 in total, since the light having not been captured by the second solar cell module 73 can be utilized, the ninth embodiment can increase the light collection efficiency and the power generation output in comparison with the solar cell module according to the seventh embodiment.

Tenth Embodiment

A tenth embodiment of the present invention will be described below with reference to FIGS. 27 and 28.

Figure 27:
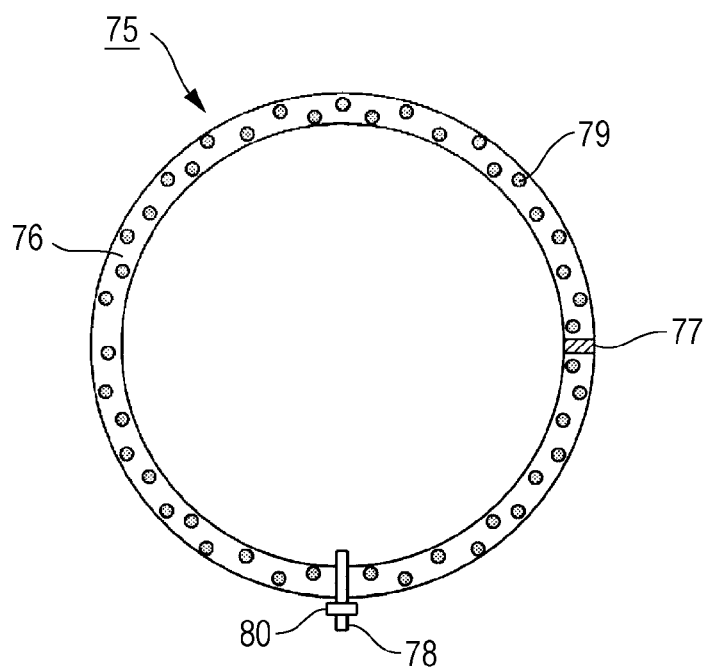
FIG. 27 is a sectional view of a solar cell module according to a tenth embodiment of the present invention.

FIG. 27 is a sectional view of a solar cell module according to a tenth embodiment. FIG. 28 illustrates one example of usage of the solar cell module according to the tenth embodiment.

A solar cell module 75 according to the tenth embodiment includes, as illustrated in FIG. 27, a light guide body 76, a solar cell element 77, and a gas inlet/outlet 78. The light guide body 76 is constituted by a hollow spherical body (structural body) made of a light-transmissive base material. While the light guide bodies in the first to ninth embodiments have rigidity, the light guide body 76 in the tenth embodiment has flexibility. Accordingly, the light guide body 76 in the tenth embodiment is deformable. On example of materials of the light guide body 76 is polyvinyl alcohol or polyvinyl chloride. Particulate phosphors 79 are dispersed inside the light guide body 76.

A solar cell element 77 having a shape of one of halves obtained by dividing a circular ring is disposed in the light guide body 76. The light guide body 76 has the gas inlet/outlet 78 through which gas is filled into an inner space of the light guide body 76, or is discharged from the inner space. The gas inlet/outlet 78 is provided with a valve 80 for opening and closing the gas inlet/outlet 78.

In use of the solar cell module 75 according to the tenth embodiment, the valve 80 of the gas inlet/outlet 78 is opened, and gas having lower specific gravity than air outside the light guide body 76, such as hydrogen or helium, is filled into the inner space of the light guide body 76. The valve 80 is then closed. By filling and confining that type of gas in the inner space of the light guide body 76 as described above, buoyancy is given to the solar cell module 75, whereby the solar cell module 75 floats up to the air. For example, by anchoring the solar cell module 75 to the rooftop of a building K with, e.g., a string 81, as illustrated in FIG. 28, the solar cell module 75 can be caused to float in the sky above the building K. In the case of stopping the use of the solar cell module 75, the valve 80 of the gas inlet/outlet 78 is opened and the gas inside the light guide body 76 is discharged. Thereafter, the light guide body 76 can be folded up.

With the tenth embodiment, since the gas having relatively low specific gravity can be filled and confined in the inner space of the light guide body 76, the total weight of the solar cell module 75 can be reduced. As a result, the strength of a foundation in a place where the solar cell module 75 is installed is not required to be so high, and demands in strength design can be reduced. In addition, the solar cell module 75 can be installed, for example, even on the rooftop of a building of which strength is insufficient for installation of the related-art solar cell module, and flexibility in choice of the installed place is increased.

Moreover, since the gas can be optionally filled into and discharged from the light guide body 76, it is possible to fold up the light guide body 76, for example, in the case of rainy or cloudy weather or when the power generation is not needed, and to spread the light guide body 76, for example, in the case of fine weather or when the power generation is needed. Accordingly, the solar cell module 75 having portability and convenience in storage, which are not obtained with the related art, can be realized. In addition, if the gas leaks from the inner space of the light guide body 76, the gas can be refilled through the gas inlet/outlet 78. Hence the solar cell module 75 can be used for a long term.

Figure 28:
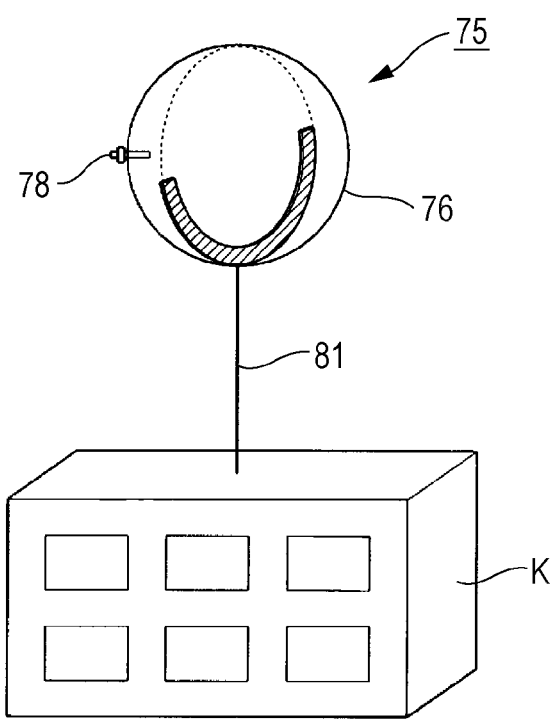
FIG. 28 illustrates usage of the solar cell module according to the tenth embodiment of the present invention.

Because of enabling the solar cell module 75 to float in the sky above the building K as illustrated in FIG. 28, even if there are high buildings in the surroundings, the sunlight is not blocked by the surrounding buildings. Therefore, the power generation output can be increased particularly in the morning and the evening during which the sun is at a relatively low position. Hence, the stable power generation output can be obtained through a day. The light guide body 76 is not limited to a spherical shape, and it may have suitable one of various shapes. Moreover, air may be filled and confined in the inner space of the light guide body 76, and a balloon filled with, e.g., helium may be connected to the light guide body 76, thus causing the light guide body 76 to float with buoyancy of the balloon. In such a case, an advertisement effect can also be given to the solar cell module 75 like an advertising balloon, for example.

Eleventh Embodiment

An eleventh embodiment of the present invention will be described below with reference to FIG. 29.

A solar cell module according to the eleventh embodiment is similar in basic structure to that in the first embodiment, and is different from the first embodiment in that the phosphor is not contained in a portion of the light guide body.

Figure 29:
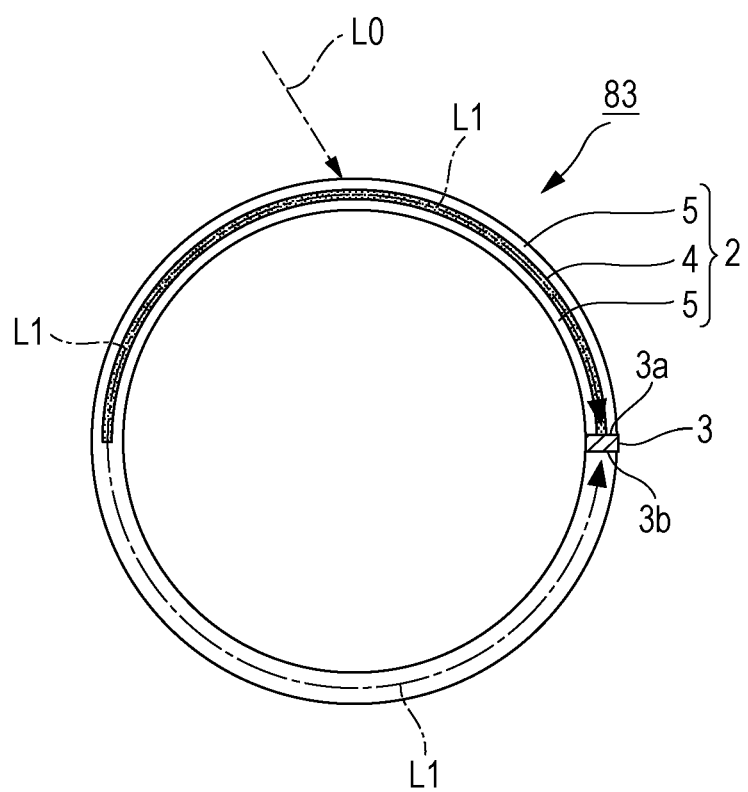
FIG. 29 is a sectional view of a solar cell module according to an eleventh embodiment of the present invention.

FIG. 29 is a sectional view of the solar cell module according to the eleventh embodiment. It is to be noted that, in FIG. 29, common components to those in FIG. 2 representing the first embodiment are denoted by the same reference signs and description of those common components is omitted.

In the first to sixth embodiments described above, the phosphor is contained in the entire inner portion of the light guide body. In contrast, in a solar cell module 83 according to the eleventh embodiment, the phosphor layer 4 is disposed only in the upper sphere of the spherical body constituting the light guide body 2, as illustrated in FIG. 29. The lower sphere is made of only the light-transmissive base material 5 without containing the phosphor layer 4. In the illustrated eleventh embodiment, the spherical body is divided into halves, i.e., one ½ portion in which the phosphor layer 4 is provided and the other ½ portion in which the phosphor layer 4 is not provided. However, the spherical body is not always required to be divided into halves, and it may be divided at an appropriate proportion depending on cases. Moreover, while the phosphor is contained in the form of a layer, the light guide body in which particulate phosphors are dispersed in the light-transmissive base material, as illustrated in FIG. 4, may also have the arrangement that the phosphors are not contained in a portion of the light guide body.

In general, a phosphor exhibits self-absorption, and the presence of the phosphor impedes propagation of light to be guided. Furthermore, the light guide body is illuminated with the sunlight from above in many cases. From that point of view, it is advantageous that the phosphor is not contained in the lower hemisphere side of the spherical body. The eleventh embodiment is on the basis of that concept. In the light guide body 2 in the eleventh embodiment, the upper hemisphere serves to emit fluorescent light and to guide the emitted light, whereas the lower hemisphere serves only to guide the light.

The eleventh embodiment can also provide similar advantageous effects to those in the first to fifth embodiments, i.e., such capabilities as realizing the solar cell module with high light collection efficiency, suppressing the variations in power generation output, reducing the weight and the cost of the solar cell module, and improving the degree of freedom in selecting the installed position of the solar cell module. The solar cell module 83 according to the eleventh embodiment is different from the solar cell module (FIG. 9) according to the third embodiment, which employs the hemispherical light guide body, in that the inside of the light guide body 2 in the eleventh embodiment can be formed as an enclosed space, and hence that the solar cell module can be employed in a wider range of applications, such as making the solar cell module floated in the sky like the tenth embodiment.

Instead of dividing the light guide body into the portion containing the phosphor and the portion not containing the phosphor, density of the phosphor contained in the light guide body may be distributed therein. Stated another way, density of the phosphor contained in the light guide body may be not uniform. In such a case, the density of the phosphor contained in a first portion of the light guide body may be relatively large, and the density of the phosphor contained in a second portion of the light guide body may be relatively small, the second portion being positioned on the opposite side to the first portion. For example, it is desired that the density of the phosphor in a portion of the light guide body, which portion is positioned closer to the sun when the solar cell module is installed, may be relatively large, and the density of the phosphor in a portion of the light guide body, which portion is positioned farther away from the sun (e.g., in a portion closer to the ground), may be relatively small.

[Solar Power Generation Apparatus]

A solar power generation apparatus according to one embodiment of the present invention will be described below with reference to FIG. 30.

FIG. 30 is a block diagram of the solar power generation apparatus according to this embodiment.

A solar power generation apparatus 100 according to this embodiment includes, as illustrated in FIG. 30, a solar cell module 103 according to one of the first to eleventh embodiments described above, the solar cell module 103 including a light guide body 101 and a solar cell element 102, an inverter 104, and a battery 105. Electric power generated by the solar cell module 103 is subjected to DC-AC conversion by the inverter 104 and is output to an external load 106. Another power source 107 is also connected to the external load 106. The electric power generated by the solar cell module 103 is charged in the battery 105 and is discharged from the battery 105 as required.

Because of including the solar cell module 103 according to one of the first to eleventh embodiments described above, this embodiment can realize the solar power generation apparatus 100, which can exhibit high power generation efficiency, which is light-weight and is easy to install, and which is relatively inexpensive.

The technical scope of the present invention is not limited to the above-described embodiments, and can be variously modified without departing from the gist of the present invention.

For example, while the foregoing embodiments have been described in connection with examples in which the light guide body has a determinate three-dimensional shape, e.g., a spherical, hemispherical, elliptical, or cubic shape, the light guide body may have an indeterminate three-dimensional shape. In addition, the light guide body is not always required to be three-dimensional in its entirety, and it may have, for example, such a shape that a flat surface is partly raised in a three-dimensional form. Even in such a case, however, the interface between a planar portion and a three-dimensional portion is needed to have a certain curvature radius that allows light to be guided through total reflection.

Moreover, the shapes, dimensions, numbers, layouts, materials, manufacturing methods, etc. of the individual components in the solar cell modules according to the above-described embodiments are not limited to the ones described in the foregoing embodiments, and they may be modified as appropriate.

INDUSTRIAL APPLICABILITY

Practical forms of the present invention can be applied to solar cell modules or solar power generation apparatuses.

REFERENCE SIGNS LIST 1, 7, 12, 15, 18, 23, 26, 30, 36, 41, 46, 47, 50, 57, 60, 63, 66, 71, 75, 103, 83 . . . solar cell modules, 2, 10, 20, 27, 37, 42, 51, 76, 101 . . . light guide bodies, 3, 13, 21, 24, 28, 31, 38, 39, 43, 44, 45, 52, 58, 61, 64, 77, 102 . . . solar cell elements, 4 . . . phosphor layer, 5 . . . light-transmissive base material, 9, 79 . . . phosphors, 25, 32, 40, 48 . . . reflecting portions, 34 . . . solar cell module array, 53 . . . uneven portion, 67 . . . solar cell module main body, 68 . . . protective member, 72 . . . first solar cell module, 73 . . . second solar cell module, 78 . . . gas inlet/outlet, and 100 . . . solar power generation apparatus.

The invention claimed is:

1. A solar cell module comprising:
a light guide body that guides incident light to propagate therein, the light guide body being a hollow shell-shaped ellipsoid body which is made of a light-transmissive base material; and
a solar cell element that receives light propagated within the light guide body, wherein
the light guide body has a first cross section and a second cross section, the second cross section being perpendicular to the first cross section, and each of the first and second cross sections including a curved portion; and
the solar cell element is arranged along a plane with a cross-sectional area that is smallest among a plurality of sectional surfaces, each of the plurality of sectional surfaces passing through a center of the hollow shell-shaped ellipsoid body.

2. The solar cell module according to claim 1, wherein the light guide body is rotatable about a first axis, the first axis passing through a center of the hollow shell-shaped ellipsoid body, the first axis not being a second axis of rotational symmetry of the hollow shell-shaped ellipsoid body.

3. The solar cell module according to claim 1, wherein an inside of the light guide body is an enclosed space, and the light guide body includes a gas inlet/outlet through which gas is filled into and discharged from the enclosed space.

4. The solar cell module according to claim 3, wherein the gas has a lower specific gravity than air, and the gas being confined in the enclosed space.

5. The solar cell module according to claim 1, wherein the hollow shell-shaped ellipsoid body includes an opening and an open inner space.

6. The solar cell module according to claim 5, wherein the solar cell element is positioned at an end surface of the hollow shell-shaped ellipsoid body, the end surface corresponding to an edge of the opening.

7. The solar cell module according to claim 1, wherein the light-transmissive base material has flexibility.

8. The solar cell module according to claim 1, wherein the light guide body contains a phosphor, the phosphor generating fluorescent light upon being excited by the incident light, and
the solar cell element receives the fluorescent light generated inside the light guide body with the incident light and propagating within the light guide body,
wherein a first density of the phosphor contained in the light guide body is not uniform.

9. The solar cell module according to claim 8, wherein a second density is larger than a third density, the second density being of the phosphor contained in a first portion of the light guide body, the third density being of the phosphor contained in a second portion of the light guide body, the second portion being positioned on opposite side of the hollow shell-shaped ellipsoid body to the first portion.

10. The solar cell module according to claim 1, wherein the light guide body includes a reflecting portion that reflects, toward the solar cell element, the light propagating within the light guide body.

11. The solar cell module according to claim 1, wherein the solar cell element has a shape of one of two halves obtained by dividing a circular ring.

12. The solar cell module according to claim 2, further comprising: a tracking device that rotates the light guide body such that an ellipse of the hollow shell-shaped ellipsoid body faces toward the Sun, the ellipse has a maximum area among a plurality of ellipses of the hollow shell-shaped ellipsoid body which are projected by the shape of the light guide body.

* * * * *